(12) United States Patent
Sumiyoshi

(10) Patent No.: US 11,167,550 B2
(45) Date of Patent: Nov. 9, 2021

(54) REDUNDANT SENSOR DATA SERIALIZATION, SENSED STATE DETERMINATION AND SENSOR MALFUNCTION DIAGNOSIS APPARATUS

(71) Applicant: FUJIFILM Corporation, Tokyo (JP)

(72) Inventor: Yuta Sumiyoshi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 303 days.

(21) Appl. No.: 16/442,554

(22) Filed: Jun. 17, 2019

(65) Prior Publication Data

US 2019/0299591 A1 Oct. 3, 2019

Related U.S. Application Data

(63) Continuation of application No. PCT/JP2017/047158, filed on Dec. 28, 2017.

(30) Foreign Application Priority Data

Jan. 12, 2017 (JP) .............................. JP2017-003472

(51) Int. Cl.
*B41J 2/045* (2006.01)
*B41J 2/14* (2006.01)
(Continued)

(52) U.S. Cl.
CPC ............... *B41J 2/0451* (2013.01); *B41J 2/01* (2013.01); *B41J 2/14072* (2013.01);
(Continued)

(58) Field of Classification Search
CPC ... B41J 2/0451; B41J 2/165; B41J 2/01; B41J 2/14072; B41J 2/14153; B41J 2002/14354;
(Continued)

(56) References Cited

U.S. PATENT DOCUMENTS 5,864,287 A * 1/1999 Evans, Jr. ............... A62C 37/50
340/506
2010/0100799 A1 4/2010 Kurachi et al.
(Continued)

FOREIGN PATENT DOCUMENTS

JP 2011096006 5/2011
JP 2016190701 11/2016
(Continued)

OTHER PUBLICATIONS

"International Search Report (Form PCT/ISA/210) of PCT/JP2017/047158", dated Mar. 6, 2018, with English translation thereof, pp. 1-4.
(Continued)

*Primary Examiner* — Eric S. McCall
*Assistant Examiner* — Timothy P Graves
(74) *Attorney, Agent, or Firm* — JCIPRNET

(57) ABSTRACT

A state determination apparatus that does not need an increase in number of inputs of a calculation element for duplicated sensors even in a case where a sensor is duplicated, and can detect a malfunction of a plurality of duplicated sensors is provided. The object is resolved by a state determination apparatus including a plurality of sensors that detect a state of the same determination target in a duplicated manner, a selector element that receives an input of the detection signal of each sensor of the plurality of sensors and sequentially outputs the detection signal of one sensor among the detection signals of the sensors in synchronization with a first clock signal having a first frequency, and a storage unit that receives an input of an output signal of the selector element and sequentially stores a logical level of the output signal of the selector element in a bit width greater than or equal to the number of the plurality of sensors in
(Continued)

synchronization with a second clock signal having a second frequency higher than or equal to the first frequency.

11 Claims, 15 Drawing Sheets

(51) Int. Cl.
    *G01R 31/00*     (2006.01)
    *B41J 2/165*     (2006.01)
    *G08B 29/16*     (2006.01)
    *B41J 2/01*     (2006.01)

(52) U.S. Cl.
    CPC ........... *B41J 2/14153* (2013.01); *B41J 2/165* (2013.01); *G01R 31/00* (2013.01); *G08B 29/16* (2013.01); *B41J 2002/14354* (2013.01)

(58) Field of Classification Search
    CPC .......... B41J 2/16552; B41J 2002/16558; B41J 2/16535; B41J 2002/1655; B41J 2/04541; B41J 2/04586; G01R 31/00; G08B 29/16
    See application file for complete search history.

(56) References Cited

U.S. PATENT DOCUMENTS

| | | | |
|---|---|---|---|
| 2013/0021135 A1* | 1/2013 | Kurachi | ................... G05B 9/02 |
| | | | 340/3.43 |
| 2015/0036700 A1* | 2/2015 | Lee | ......................... H04L 12/12 |
| | | | 370/537 |

FOREIGN PATENT DOCUMENTS

| | | |
|---|---|---|
| WO | 2008038710 | 4/2008 |
| WO | 2011135656 | 11/2011 |

OTHER PUBLICATIONS

"Written Opinion of the International Searching Authority (Form PCT/ISA/237) of PCT/JP2017/047158", dated Mar. 6, 2018, with English translation thereof, pp. 1-7.

* cited by examiner

REDUNDANT SENSOR DATA SERIALIZATION, SENSED STATE DETERMINATION AND SENSOR MALFUNCTION DIAGNOSIS APPARATUS

CROSS-REFERENCE TO RELATED APPLICATIONS

The present application is a Continuation of PCT International Application No. PCT/JP2017/047158 filed on Dec. 28, 2017 claiming priority under 35 U.S.C. § 119(a) to Japanese Patent Application No. 2017-003472 filed on Jan. 12, 2017. Each of the above applications is hereby expressly incorporated by reference, in their entirety, into the present application.

BACKGROUND OF THE INVENTION

1. Field of the Invention

The present invention relates to a state determination apparatus and particularly, to a state determination apparatus including a plurality of redundant sensors.

2. Description of the Related Art

In an ink jet recording device, maintaining the quality of an ink jet head is an important object for maintaining image quality. Thus, the quality of the ink jet head is maintained by performing periodic maintenance such as moisturizing by capping the ink jet head and wiping using a web.

In order to perform such maintenance, various sensors are disposed for mechanical driving of an ink jet head unit and a maintenance unit, and detect the presence of the ink jet head unit at an appropriate position, correct mounting of the web on the maintenance unit, and the like.

In a case where the sensor fails, the maintenance operation cannot be performed, and the ink jet head is left for a period until the sensor is replaced. A risk of being unable to maintain the quality of the ink jet head occurs.

Thus, as a measure, it is considered that robustness of a system is improved by securing redundancy by duplicating the sensors.

In order to secure the reliability of detection, JP2016-190701A discloses a technology for installing two sensors for each type of sensor and determining a failure of the sensor in a case where a state where detection signals of two sensors having the same role do not match occurs.

SUMMARY OF THE INVENTION

However, in a case where the sensors are duplicated, a necessary number of input and output terminals of a calculation device such as a field programmable gate array (FPGA) calculating detection results of the sensors is increased depending on the number of duplicated sensors. Consequently, a large-scale calculation device is needed, and a problem of an increase in cost arises.

The present invention is conceived in view of such a matter. An object of the present invention is to provide a state determination apparatus that does not need an increase in number of inputs of a calculation element for duplicated sensors even in a case where a sensor is duplicated, and can detect a malfunction of a plurality of duplicated sensors.

In order to achieve the object, an aspect of a state determination apparatus comprises a plurality of sensors that detect a state of the same determination target in a duplicated manner, each sensor outputting a high level detection signal in a case where the determination target is in a first state and outputting a low level detection signal in a case where the determination target is in a second state different from the first state, a selector element that receives an input of the detection signal of each sensor of the plurality of sensors and sequentially outputs the detection signal of one sensor among the detection signals of the sensors in synchronization with a first clock signal having a first frequency, and a calculation element that receives an input of an output signal of the selector element. The calculation element includes a storage unit that sequentially stores a logical level of the output signal of the selector element in a bit width greater than or equal to the number of the plurality of sensors in synchronization with a second clock signal having a second frequency higher than or equal to the first frequency, a determination unit that determines whether the determination target is in the first state or the second state based on the stored logical levels, and a diagnosis unit that diagnoses a malfunction in at least one sensor of the plurality of sensors based on the stored logical levels.

According to the present aspect, the selector element that receives the input of the detection signal of each sensor of the plurality of sensors detecting the state of the same determination target in a duplicated manner is used. Thus, it is not necessary to increase the number of inputs of the calculation element for the duplicated sensors even in a case where the sensor is duplicated, and a malfunction of the plurality of duplicated sensors can be detected.

It is preferable that the determination unit performs the determination using a logical sum or a non-conjunction of the stored logical levels. Accordingly, the determination as to whether the determination target is in the first state or the second state can be appropriately performed.

It is preferable that the diagnosis unit performs the diagnosis using non-matching between the stored logical levels. Accordingly, a malfunction in at least one sensor of the plurality of sensors can be appropriately diagnosed.

It is preferable that the storage unit is a calculation unit that sequentially reads the logical levels of the output signal of the selector element in synchronization with the second clock signal and stores the read logical levels in a memory. Accordingly, the logical levels of the output signal of the selector element can be appropriately stored.

It is preferable that the storage unit is a shift register in which a plurality of registers corresponding in number to the bit width are connected in series. Accordingly, the logical levels of the output signal of the selector element can be appropriately stored.

It is preferable that the diagnosis unit includes a gate element that receives an input of an output signal of the plurality of registers, and a filter circuit that attenuates a high-frequency component of an output signal of the gate element, and a time constant of the filter circuit is greater than or equal to a product of a multiplicative inverse of the second frequency and the number of registers of the plurality of registers. Accordingly, an erroneous diagnosis of the diagnosis unit in a case where the determination target changes to the second state from the first state or to the first state from the second state can be prevented.

It is preferable that the second clock signal is a signal obtained by multiplying the first clock signal and shifting a phase. Accordingly, the logical levels of the output signal of the selector element can be appropriately stored in the storage unit.

It is preferable that the number of the bit width is the number of the plurality of sensors. Accordingly, the shift register can be configured with the minimum number of registers.

It is preferable that the state determination apparatus further comprises an oscillation circuit, and the first clock signal is supplied from the oscillation circuit. Accordingly, the first clock signal can be appropriately supplied.

It is preferable that the first clock signal is supplied from the calculation element. Accordingly, the first clock signal can be appropriately supplied.

It is preferable that the state determination apparatus further comprises a plurality of light emitting diodes for which whether or not to emit light is individually controlled depending on a logical level of the detection signal of each sensor of the plurality of sensors. Accordingly, a user can recognize a detection status of the sensors.

It is preferable that the selector element and the calculation element are mounted on different substrates. Accordingly, a substrate on which the calculation element is mounted in the related art can be used without modification.

It is preferable that the first state is a state where the determination target is not present, and the second state is a state where the determination target is present. A sensor detecting the presence of the determination target can be used as the plurality of sensors.

According to the present invention, it is not necessary to increase the number of inputs of the calculation element for the duplicated sensors even in a case where the sensor is duplicated, and a malfunction of the plurality of duplicated sensors can be detected.

BRIEF DESCRIPTION OF THE DRAWINGS

FIG. 10 is a timing chart illustrating a selection signal and the like.

FIG. 13 is a timing chart illustrating the selection signal and the like.

DESCRIPTION OF THE PREFERRED EMBODIMENTS

Hereinafter, preferred embodiments of the present invention will be described in detail in accordance with the appended drawings.

Form of State Determination Apparatus in Related Art

Figure 1:
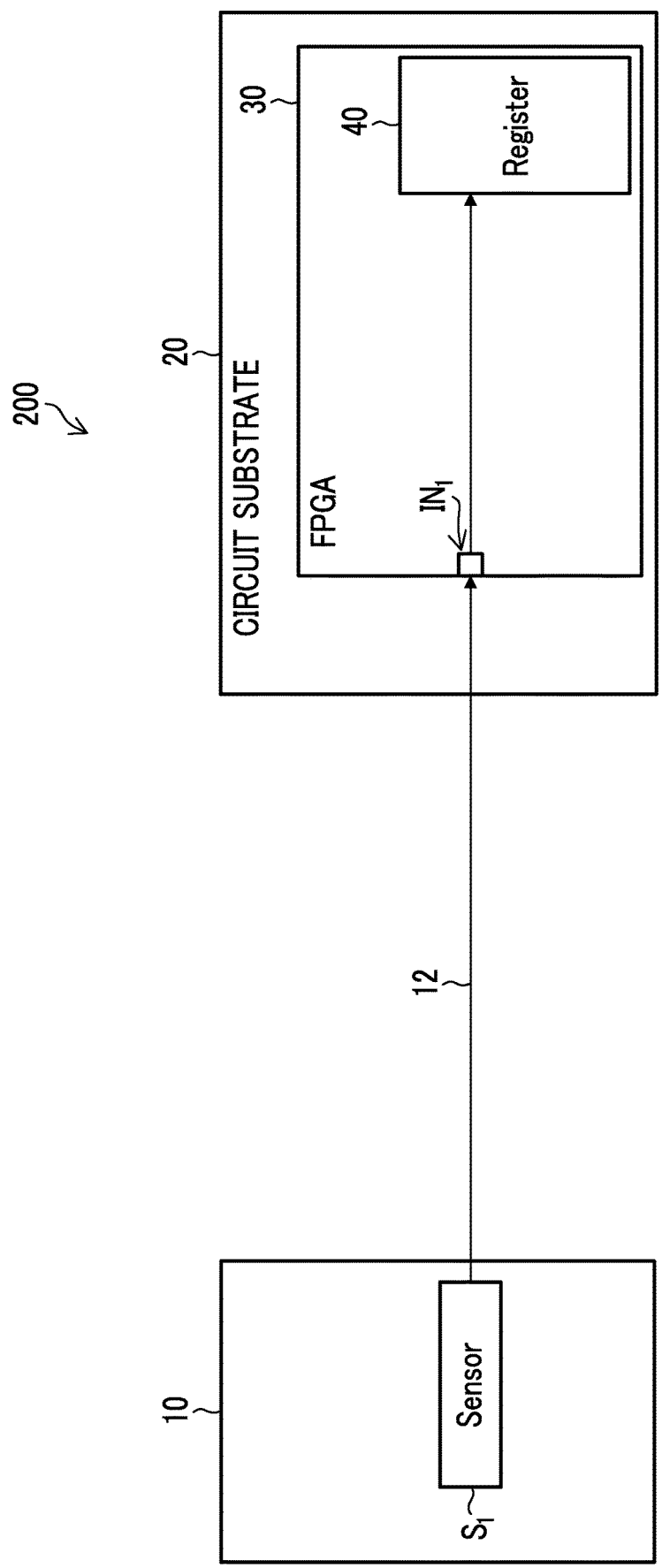
FIG. 1 is a configuration diagram illustrating an overall configuration of a state determination apparatus in the related art.

FIG. 1 is a configuration diagram illustrating an overall configuration of a state determination apparatus 200 in the related art.

The state determination apparatus 200 is a device determining the state of a determination target object 10 and is configured to include a sensor $S_1$ comprised in the determination target object 10, a circuit substrate 20, and a field programmable gate array (FPGA) 30.

The sensor $S_1$ is state detection means that includes an analog digital conversion unit and outputs a logical high level detection signal (power supply potential) in a case where the determination target object 10 is in a first state, and outputs a logical low level detection signal (ground potential) in a case where the determination target object 10 is in a second state different from the first state.

For example, the first state and the second state are such that the first state is a state where the determination target object 10 is not present at an appropriate position, and the second state is a state where the determination target object 10 is present at the appropriate position. In addition, the first state may be a state where the determination target object 10 is not mounted, and the second state may be a state where the determination target object 10 is mounted. The first state may be a state where the determination target object 10 is dry, and the second state may be a state where the determination target object 10 is moist with respect to a preset threshold.

The FPGA 30 is mounted on the circuit substrate 20 as a calculation device. The FPGA 30 includes an $IN_1$ terminal as an input terminal and a register 40.

The register 40 is a calculation processing unit comprising a central processing unit (CPU), a read-only memory (ROM), and a random access memory (RAM), not illustrated.

An output signal of the sensor $S_1$ is connected to the $IN_1$ terminal of the FPGA 30 through a wire 12, and the $IN_1$ terminal is connected to the register 40 inside the FPGA 30.

In the state determination apparatus 200 configured in such a manner, the state of the determination target object 10 is detected by the sensor $S_1$, and the high level or low level detection signal corresponding to the state is output from the sensor $S_1$. The detection signal is input into the FPGA 30 through the wire 12. The register 40 of the FPGA 30 determines whether the determination target object 10 is in the first state or the second state by determining the logical level of the detection signal. In addition, the FPGA 30 performs an operation corresponding to the determination result.

A case where the sensor $S_1$ fails, and the sensor $S_1$ outputs the logical low level detection signal regardless of the determination target object 10 in the first state is considered. In this case, the state determination apparatus 200 determines that the determination target object 10 is in the second state.

Figure 2:
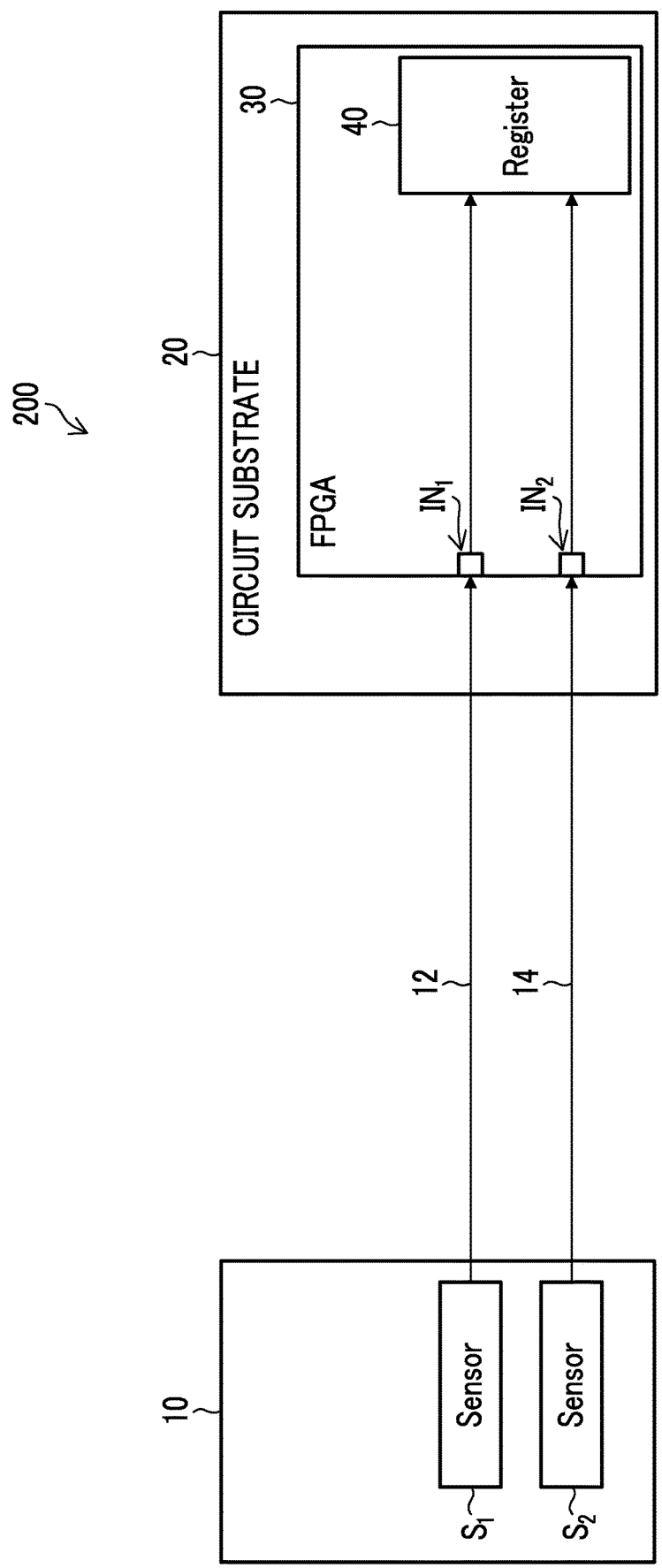
FIG. 2 is a configuration diagram illustrating an overall configuration of a state determination apparatus in which state detection means is duplicated.

In order to avoid such a risk, it is considered that the state detection means is duplicated. FIG. 2 is a configuration diagram illustrating an overall configuration of the state determination apparatus 200 in which the state detection means is duplicated. A case where two state detection means of sensors $S_1$ and $S_2$ detecting the state of the same determination target object 10 in a duplicated manner are disposed is illustrated. The sensor $S_2$ is state detection means equivalent to the sensor $S_1$ and outputs the logical high level detection signal in a case where the determination target object 10 is in the first state, and outputs the logical low level detection signal in a case where the determination target object 10 is in the second state different from the first state.

The output signal of the sensor $S_1$ is connected to the $IN_1$ terminal of the FPGA 30 through the wire 12, and an output signal of the sensor $S_2$ is connected to an $IN_2$ terminal of the FPGA 30 through a wire 14. Each of the $IN_1$ terminal and the $IN_2$ terminal of the FPGA 30 is connected to the register 40 inside the FPGA 30.

In such a configuration of the state determination apparatus 200, even in a case where the sensor $S_1$ fails, and the sensor $S_1$ outputs the logical low level detection signal regardless of the determination target object 10 in the first state, the sensor $S_2$ outputs the logical high level detection signal. Thus, the register 40 can determine that the determination target object 10 is in the first state.

However, the state determination apparatus 200 needs input terminals of the FPGA 30 corresponding in number to the sensors. Accordingly, in a case where the sensor is duplicated, a large-scale FPGA 30 is needed, and cost is increased.

First Embodiment

Overall Configuration of State Determination Apparatus

Figure 3:
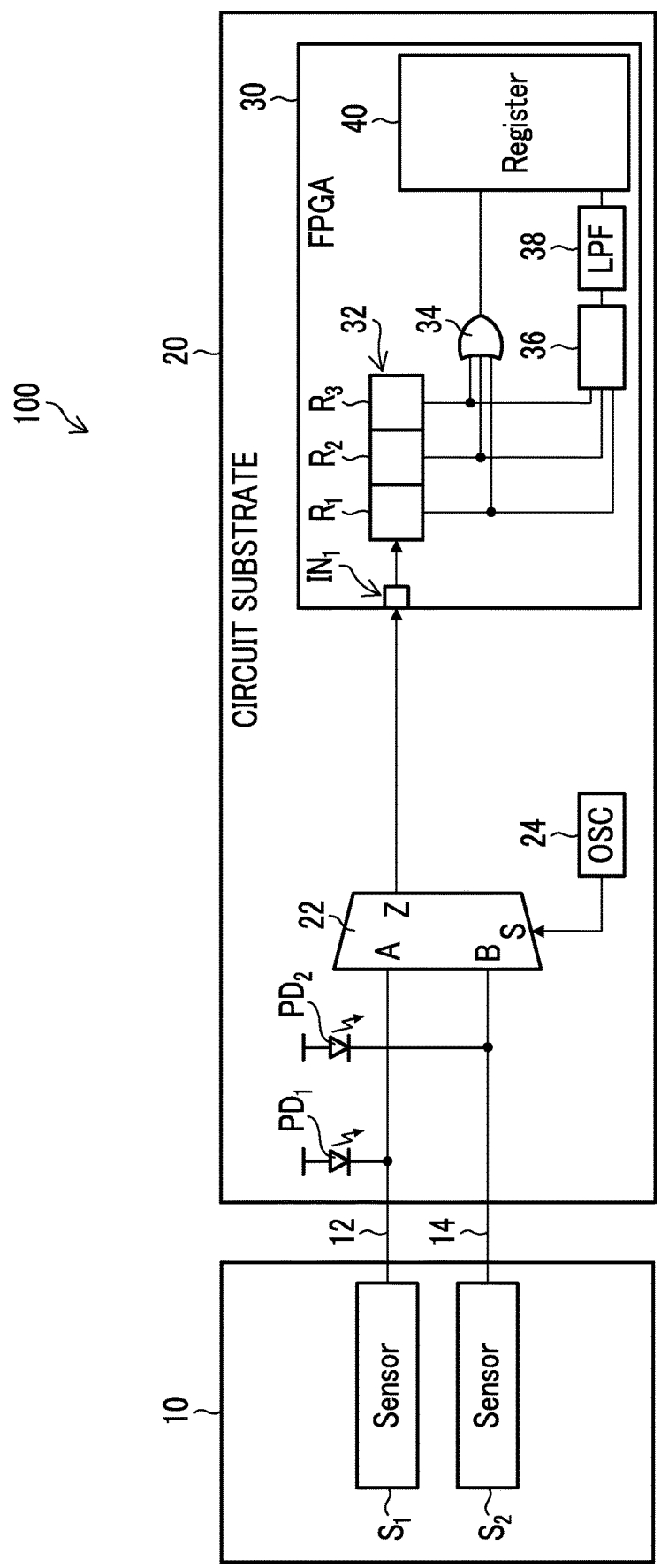
FIG. 3 is a configuration diagram illustrating an overall configuration of a state determination apparatus according to an embodiment.

FIG. 3 is a configuration diagram illustrating an overall configuration of a state determination apparatus 100 according to a first embodiment. Common parts in the configuration diagram illustrated in FIG. 2 will be designated by the same reference signs, and detailed descriptions of such parts will not be repeated.

The state determination apparatus 100 comprises display light emitting diodes $PD_1$ and $PD_2$, a selector 22, and an oscillator 24 in the circuit substrate 20. In addition, a shift register 32, a sensor detection circuit OR gate 34, a failure detection circuit 36, and a low-pass filter 38 are comprised inside the FPGA 30 (one example of a calculation element).

The selector 22 (one example of a selector element) is a selection circuit element (multiplexer) comprising an A terminal and a B terminal into which selected signals are input, an S terminal into which a selection signal is input, and a Z terminal from which a selection result is output. In a case where the logical level of the input signal of the S terminal is the high level, the selector 22 selects and outputs the logical level of the input signal of the A terminal from the Z terminal. In a case where the logical level of the input signal of the S terminal is the low level, the selector 22 selects and outputs the logical level of the input signal of the B terminal from the Z terminal.

The detection signal of the sensor $S_1$ is input into the A terminal of the selector 22 through the wire 12, and the detection signal of the sensor $S_2$ is input into the B terminal of the selector 22 through the wire 14.

In addition, a cathode of the display light emitting diode $PD_1$ is connected to the wire 12, and a cathode of the display light emitting diode $PD_2$ is connected to the wire 14. Anodes of the display light emitting diodes $PD_1$ and $PD_2$ are connected to the power supply potential. Accordingly, in a case where the detection signal of the sensor $S_1$ is at the high level, the display light emitting diode $PD_1$ emits light. In a case where the detection signal of the sensor $S_2$ is at the high level, the display light emitting diode $PD_2$ emits light.

The oscillator 24 (one example of a first signal generation unit) includes a crystal oscillation circuit and a buffer circuit, not illustrated, and outputs a selection signal $CLK_1$ (one example of a first clock signal) that is a rectangular signal having a frequency of 1 kHz (one example of a first frequency) and a duty of 50%. The output of the oscillator 24 is input into the S terminal of the selector 22.

The Z terminal of the selector 22 is connected to the $IN_1$ terminal of the FPGA 30, and the $IN_1$ terminal is connected to the input of the shift register 32 inside the FPGA 30.

The shift register 32 (one example of a storage unit) includes registers of a bit width greater than or equal to the number of sensors and is configured such that three registers including an initial stage register $R_1$, an intermediate stage register $R_2$, and a last stage register $R_3$ are connected in series for two sensors. That is, the $IN_1$ terminal is connected to the input of the initial stage register $R_1$. The output of the initial stage register $R_1$ is connected to the input of the intermediate stage register $R_2$. The output of the intermediate stage register $R_2$ is connected to the input of the last stage register $R_3$.

A sampling signal $CLK_2$ (one example of a second clock signal) that is a rectangular signal having a frequency of 3 kHz (one example of a second frequency higher than or equal to the first frequency) and a duty of 50% is input into the shift register 32. Each of the initial stage register $R_1$, the intermediate stage register $R_2$, and the last stage register $R_3$ stores the input signal in synchronization with a falling edge of the sampling signal $CLK_2$. That is, the shift register 32 sequentially transfers the output signal of the selector 22 to the initial stage register $R_1$, the intermediate stage register $R_2$, and the last stage register $R_3$ at a frequency of 3 kHz.

The sensor detection circuit OR gate 34 is a logical sum element having three inputs. The output signal of the initial stage register $R_1$, the output signal of the intermediate stage register $R_2$, and the output signal of the last stage register $R_3$ are input into the sensor detection circuit OR gate 34. In a case where all of three input signals are at the low level, the sensor detection circuit OR gate 34 outputs the low level output signal. In a case where at least one of three input signals is at the high level, the sensor detection circuit OR gate 34 outputs the high level output signal. The output of the sensor detection circuit OR gate 34 is input into the register 40. The sensor detection circuit OR gate 34 and the register 40 operate as a determination unit.

While an OR gate is used because the sensors $S_1$ and $S_2$ are handled using a positive logic, a NAND gate that is a non-conjunction element may be used in a case where the sensors $S_1$ and $S_2$ are handled using a negative logic.

In addition, three output signals of the initial stage register $R_1$, the intermediate stage register $R_2$, and the last stage register $R_3$ are input into the failure detection circuit 36. In a case where both of the sensors $S_1$ and $S_2$ are normal, the failure detection circuit 36 outputs the low level signal. In a case where at least one of the sensors $S_1$ and $S_2$ has a malfunction, the failure detection circuit 36 outputs the high level signal. Details of the failure detection circuit 36 will be described below.

The output of the failure detection circuit 36 is input into the register 40 through the low-pass filter 38. The failure detection circuit 36, the low-pass filter 38, and the register 40 operate as a diagnosis unit that performs a diagnosis using non-matching between the logical levels of the storage contents of the shift register 32.

The low-pass filter 38 is a filter circuit that attenuates a high-frequency component of the output signal of the failure detection circuit 36. An analog type filter circuit configured with a capacitor element, not illustrated, connected in parallel between a resistor element, not illustrated, connected in series to the output of the failure detection circuit 36 and the ground potential is used.

In a case where the logical levels of the detection signals of the sensors $S_1$ and $S_2$ are changed from the low level to the high level or from the high level to the low level due to a change in state of the determination target object 10, the output of the failure detection circuit 36 is temporarily at the high level in a transition state of the storage contents of the shift register 32.

The low-pass filter 38 prevents erroneous detection of a malfunction caused by an input of the temporary high level into the register 40. Accordingly, a time constant of the low-pass filter 38 needs to be set to be greater than or equal to the product of the cycle of the sampling signal $CLK_2$ and the bit width of the shift register 32 (one example of greater than or equal to the product of the multiplicative inverse of the second frequency and the number of registers of a plurality of registers). The cycle of the sampling signal $CLK_2$ is 1/(3 kHz)=0.333 ms, and the bit width of the shift register 32 is 3 bits including the initial stage register $R_1$, the intermediate stage register $R_2$, and the last stage register $R_3$. Thus, the time constant of the low-pass filter 38 is greater than or equal to 0.333 ms×3≈1 ms.

Operation of State Determination Apparatus

Figure 4:
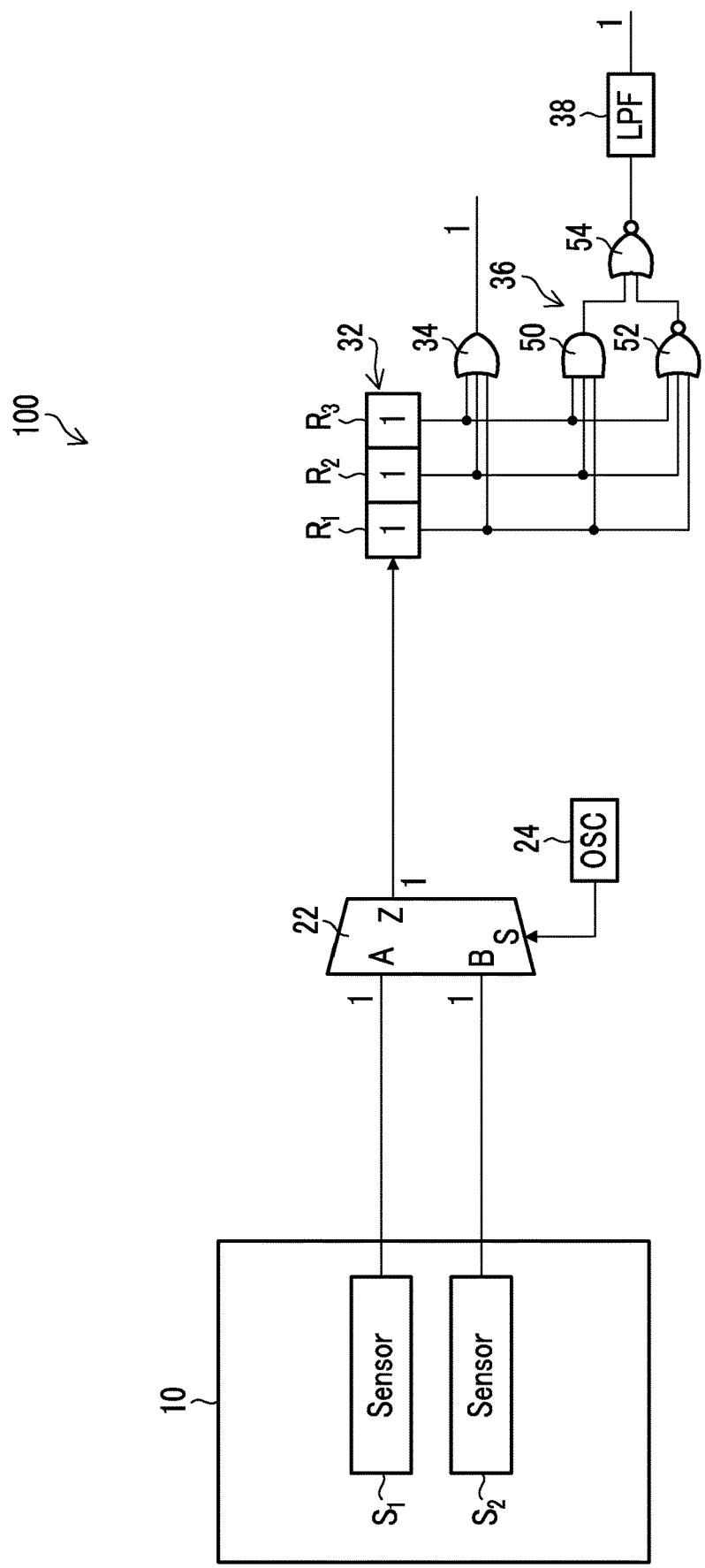
FIG. 4 is a diagram for describing an operation principle of the state determination apparatus.
Figure 5:
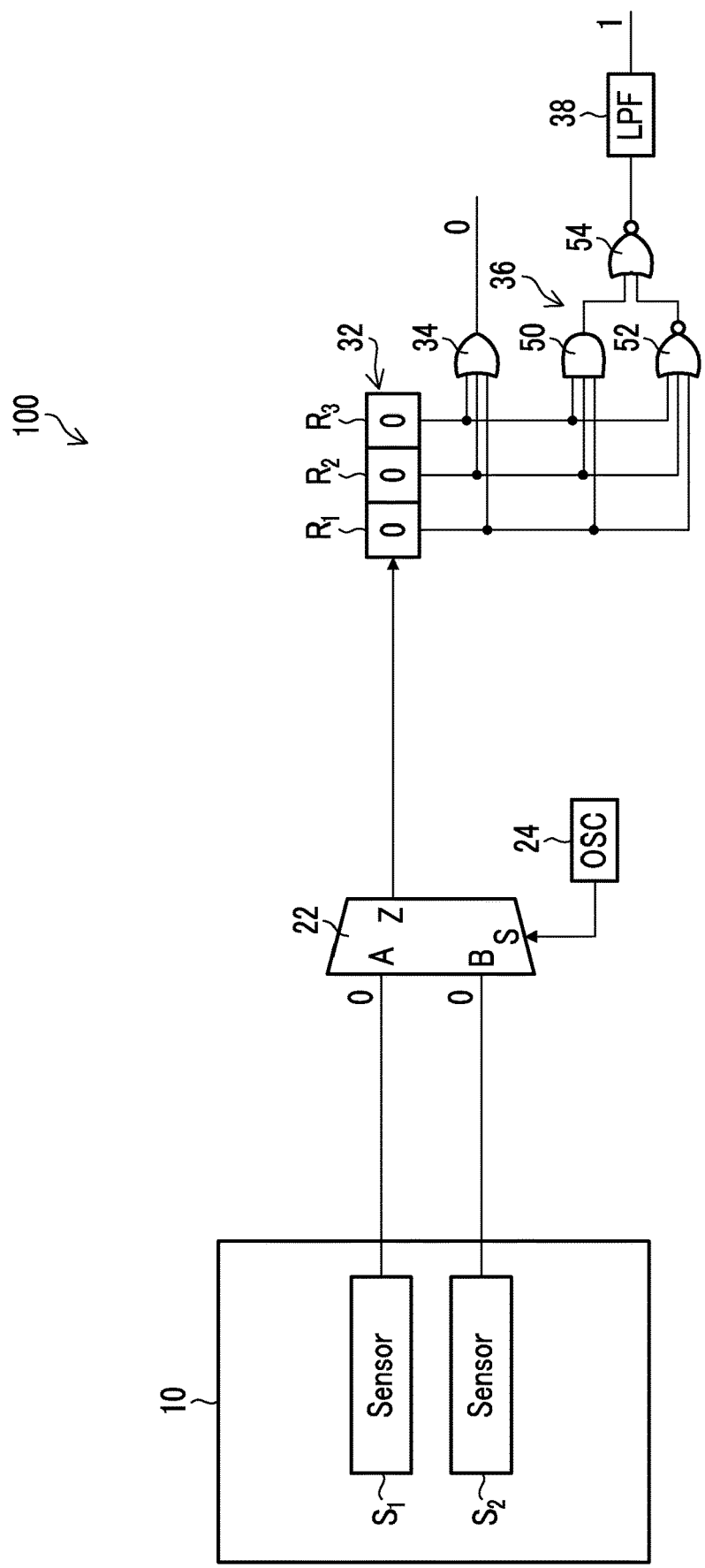
FIG. 5 is a diagram for describing the operation principle of the state determination apparatus.
Figure 6:
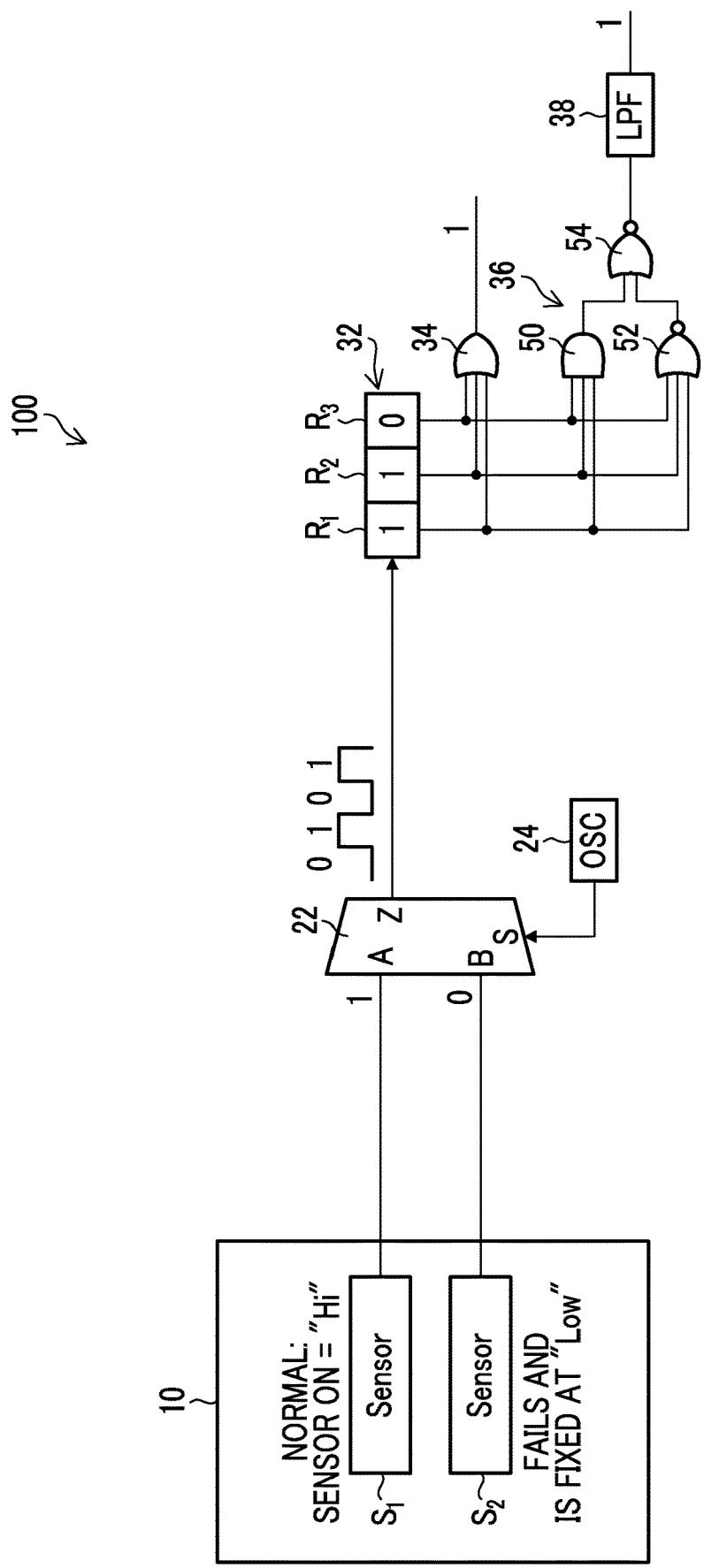
FIG. 6 is a diagram for describing the operation principle of the state determination apparatus.

FIG. 4 to FIG. 6 are diagrams for describing an operation principle of the state determination apparatus 100.

The failure detection circuit 36 comprises an AND gate 50, a NOR gate 52, and a NOR gate 54.

The AND gate 50 is a logical product element having three inputs. The output signal of the initial stage register $R_1$, the output signal of the intermediate stage register $R_2$, and the output signal of the last stage register $R_3$ are input into the AND gate 50. In a case where all of three input signals are at the high level, the AND gate 50 outputs the high level output signal. In a case where at least one of three input signals is at the low level, the AND gate 50 outputs the low level output signal. The output of the AND gate 50 is input into the NOR gate 54.

The NOR gate 52 is a negated logical sum element having three inputs. The output signal of the initial stage register $R_1$, the output signal of the intermediate stage register $R_2$, and the output signal of the last stage register $R_3$ are input into the NOR gate 52. In a case where all of three input signals are at the low level, the NOR gate 52 outputs the high level output signal. In a case where at least one of three input signals is at the high level, the NOR gate 52 outputs the low level output signal. The output of the NOR gate 52 is input into the NOR gate 54.

In addition, the NOR gate 54 is a negated logical sum element having two inputs. The output signals of the AND gate 50 and the NOR gate 52 are input into the NOR gate 54. In a case where all of two input signals are at the low level, the NOR gate 54 outputs the high level output signal. In a case where at least one of two input signals is at the high level, the NOR gate 54 outputs the low level output signal. The output signal of the NOR gate 54 is input into the low-pass filter 38 as the output signal of the failure detection circuit 36.

FIG. 4 illustrates a case where the determination target object 10 is in the first state, the sensors $S_1$ and $S_2$ normally operate, and both of the logical levels of the detection signals of the sensors $S_1$ and $S_2$ are the high level. In this case, in the selector 22, both of the logical levels of the signals input into the A terminal and the B terminal are the high level. Thus, the logical level of the output signal of the Z terminal is the high level regardless of the logical level of the S terminal.

Accordingly, in the shift register 32, all of the logical levels of the output signals of the initial stage register $R_1$, the intermediate stage register $R_2$, and the last stage register $R_3$ are the high level.

Consequently, the logical level of the output signal of the sensor detection circuit OR gate 34 is the high level. The register 40 (refer to FIG. 3) determines that the determination target object 10 is in the first state based on the high level signal input from the sensor detection circuit OR gate 34.

In addition, the logical level of the output signal of the AND gate 50 of the failure detection circuit 36 is the high level. Thus, the logical level of the output signal of the NOR gate 54 that is the output of the failure detection circuit 36 is the low level. This signal is input into the register 40 through the low-pass filter 38. The register 40 diagnoses the sensors $S_1$ and $S_2$ as being normal based on the low level signal.

FIG. 5 illustrates a case where the determination target object 10 is in the second state, the sensors $S_1$ and $S_2$ normally operate, and both of the logical levels of the detection signals of the sensors $S_1$ and $S_2$ are the low level. In this case, in the selector 22, both of the logical levels of the signals input into the A terminal and the B terminal are the low level. Thus, the logical level of the output signal of the Z terminal is the low level.

Accordingly, in the shift register 32, all of the logical levels of the output signals of the initial stage register $R_1$, the intermediate stage register $R_2$, and the last stage register $R_3$ are the low level.

Consequently, the logical level of the output signal of the sensor detection circuit OR gate 34 is the low level. The register 40 determines that the determination target object 10 is in the second state based on the low level signal input from the sensor detection circuit OR gate 34.

In addition, the logical level of the output signal of the NOR gate 52 is the high level. Thus, the logical level of the output signal of the NOR gate 54 that is the output of the failure detection circuit 36 is the low level. The register 40 diagnoses the sensors $S_1$ and $S_2$ as being normal based on the low level signal.

Meanwhile, FIG. 6 illustrates a case where the determination target object 10 is in the first state, the sensor $S_1$ normally operates, and the logical level of the detection signal of the sensor $S_1$ is the high level, but the sensor $S_2$ fails and does not normally operate, and the logical level of the detection signal of the sensor $S_2$ is fixed at the low level.

In this case, the logical level of the input signal of the A terminal of the selector 22 is the high level, and the logical level of the input signal of the B terminal is the low level. Thus, while the logical level of the signal of the S terminal is the high level, the logical level of the signal of the Z terminal is output as the high level of the A terminal. While the logical level of the signal of the S terminal is the low level, the logical level of the signal of the Z terminal is output as the low level of the B terminal. Consequently, the logical high level signal and the logical low level signal are sequentially output from the Z terminal in synchronization with a rectangular signal of 1 kHz input into the S terminal.

The signal that repeats the logical levels of the high level and the low level at 1 kHz is input into the shift register 32. The shift register 32 sequentially stores the input signal in the initial stage register $R_1$, the intermediate stage register $R_2$, and the last stage register $R_3$ in synchronization with the sampling signal $CLK_2$ of 3 kHz.

Figure 7:
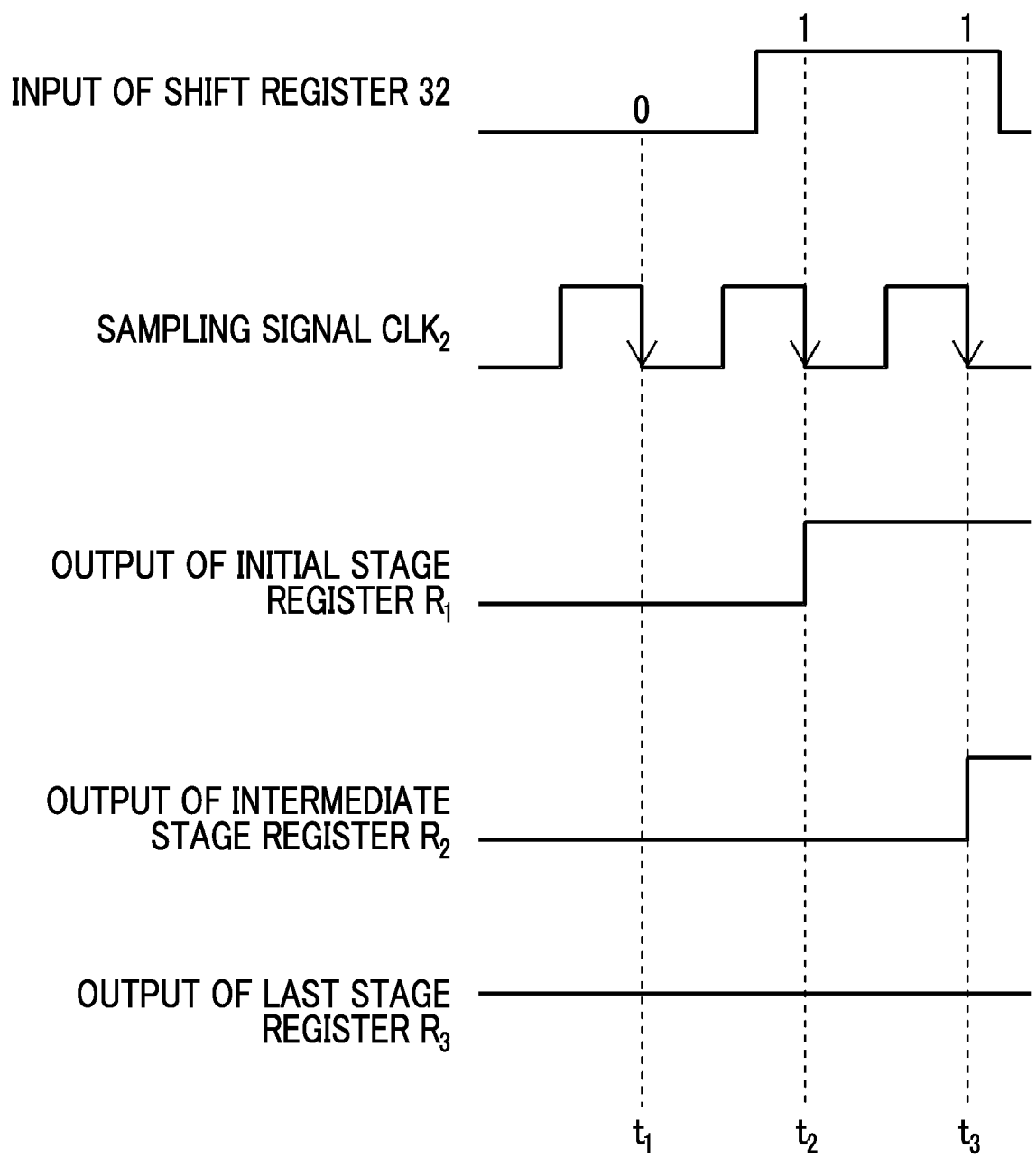
FIG. 7 is a timing chart illustrating an input signal and the like of a shift register.

FIG. 7 is a timing chart of the input signal of the shift register 32, the sampling signal $CLK_2$ of the shift register 32, the output signal of the initial stage register $R_1$, the output signal of the intermediate stage register $R_2$, and the output signal of the last stage register $R_3$.

As illustrated in FIG. 7, at time $t_1$ that is the initial fall timing of the sampling signal $CLK_2$, the logical level of the input signal of the shift register 32 is the low level. Accordingly, the logical low level is stored in the initial stage register $R_1$.

At time $t_2$ that is the subsequent fall timing of the sampling signal $CLK_2$, the logical level of the input signal of the shift register 32 is the high level. Accordingly, the logical high level is stored in the initial stage register $R_1$. In addition, the logical low level stored in the initial stage register $R_1$ at time $t_1$ is shifted and stored in the intermediate stage register $R_2$.

At time $t_3$ that is the subsequent fall timing of the sampling signal $CLK_2$, the logical level of the input signal of the shift register 32 is the high level. Accordingly, the logical high level is stored in the initial stage register $R_1$. In addition, the logical high level stored in the initial stage register $R_1$ at time $t_2$ is shifted and stored in the intermediate stage register $R_2$, and the logical low level stored in the intermediate stage register $R_2$ at time $t_2$ is shifted and stored in the last stage register $R_3$.

Accordingly, at a time after time $t_3$, the logical levels of the output signals of the initial stage register $R_1$, the intermediate stage register $R_2$, and the last stage register $R_3$ are the high level, the high level, and the low level in this order.

Consequently, the logical level of the output signal of the sensor detection circuit OR gate 34 is the high level. The register 40 determines that the determination target object 10 is in the first state based on the high level signal input from the sensor detection circuit OR gate 34.

In addition, the logical levels of the output signals of the AND gate 50 and the NOR gate 52 of the failure detection circuit 36 are the low level. The logical level of the output signal of the NOR gate 54 that is the output of the failure detection circuit 36 is the high level. The register 40 diagnoses at least one of the sensors $S_1$ and $S_2$ as having a malfunction based on the high level signal. A user is notified of the diagnosis result by an interface, not illustrated.

By using the selector 22, it is not necessary to increase the number of inputs of the FPGA 30 even in a case where the sensor is doubled, and a failure of one of the doubled sensors $S_1$ and $S_2$ can be detected.

In the storage contents of the shift register 32, it is necessary that the logical level of the detection signal of the sensor $S_1$ always coexists with the logical level of the detection signal of the sensor $S_2$. For example, in a case where the frequency of the sampling signal $CLK_2$ is excessively higher than the frequency of the selection signal $CLK_1$, the storage contents of the initial stage register $R_1$, the intermediate stage register $R_2$, and the last stage register $R_3$ of the shift register 32 include only the logical level of the detection signal of the sensor $S_1$ or $S_2$. Failures of the sensors $S_1$ and $S_2$ cannot be diagnosed by the output signal of the failure detection circuit 36.

Accordingly, it is necessary to set the frequency of the selection signal $CLK_1$, the frequency of the sampling signal $CLK_2$, and the bit width of the shift register 32 such that the logical levels of the detection signals of all sensors always coexist in the storage contents of the shift register 32.

In the present embodiment, the logical level of the detection signal of the sensor $S_1$ coexists with the logical level of the detection signal of the sensor $S_2$ in the storage contents of the shift register 32. Thus, the determination of the state of the determination target object 10 based on the output signal of the sensor detection circuit OR gate 34 and the diagnosis of the failures of the sensors $S_1$ and $S_2$ based on the output signal of the failure detection circuit 36 can be appropriately performed.

While a case where the sensor $S_1$ or $S_2$ fails due to the logical level of the detection signal fixed at the low level is described, the determination of the state of the determination target object 10 based on the output signal of the sensor detection circuit OR gate 34 cannot be correctly performed in a case where the failure is caused by the logical level of the detection signal fixed at the high level. Accordingly, in order to deal with a case where the failure is caused by the logical level of the detection signal fixed at the high level, it is necessary to use a fail-safe design in a system that uses the determination result of the state determination apparatus 100.

In addition, while the diagnosis as to which one of the sensors $S_1$ and $S_2$ fails cannot be performed in the register 40 in the present embodiment, the user can visually recognize which one of the sensors $S_1$ and $S_2$ fails from the light emission of the display light emitting diodes $PD_1$ and $PD_2$.

While a case where the sensor is doubled is described in the present embodiment, the present embodiment can also be applied to a case where redundancy is achieved by duplication as three or more sensors.

Second Embodiment

Figure 8:
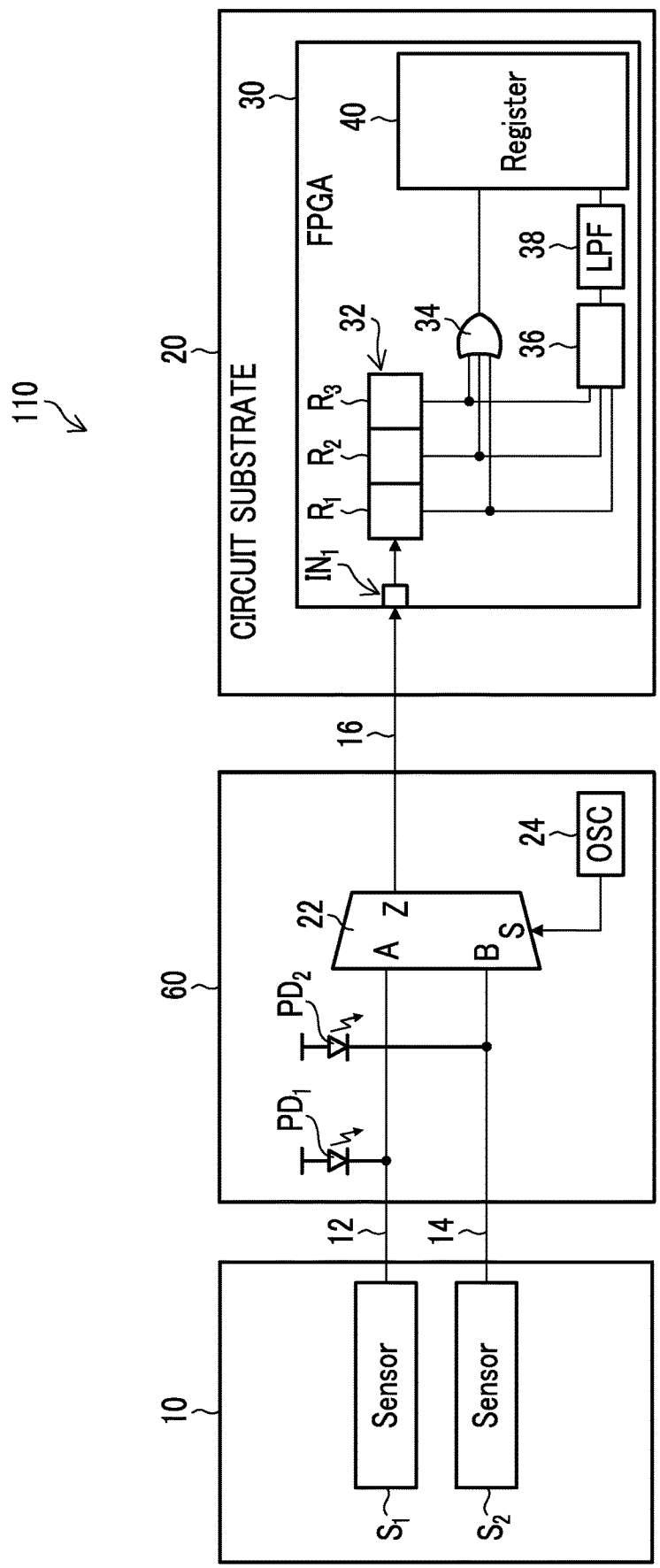
FIG. 8 is a configuration diagram illustrating an overall configuration of the state determination apparatus according to the embodiment.

FIG. 8 is a configuration diagram illustrating an overall configuration of a state determination apparatus 110 according to a second embodiment. Common parts in the configuration diagram illustrated in FIG. 3 will be designated by the same reference signs, and detailed descriptions of such parts will not be repeated.

The state determination apparatus 110 comprises a selector substrate 60 separated from the circuit substrate 20.

The display light emitting diodes $PD_1$ and $PD_2$, the selector 22, and the oscillator 24 are mounted on the selector substrate 60. In addition, the output of the selector 22 is connected to the $IN_1$ terminal of the FPGA 30 mounted on the circuit substrate 20 through a wire 16.

The operation of the state determination apparatus 110 is the same as the state determination apparatus 100.

In the state determination apparatus 110, the circuit substrate 20 in the existing state determination apparatus 200 can be used without modification. Sensor duplication and the failure diagnosis can be performed by simply installing the selector substrate 60 that is a small external substrate, and changing the internal circuit of the FPGA 30.

Third Embodiment

Figure 9:
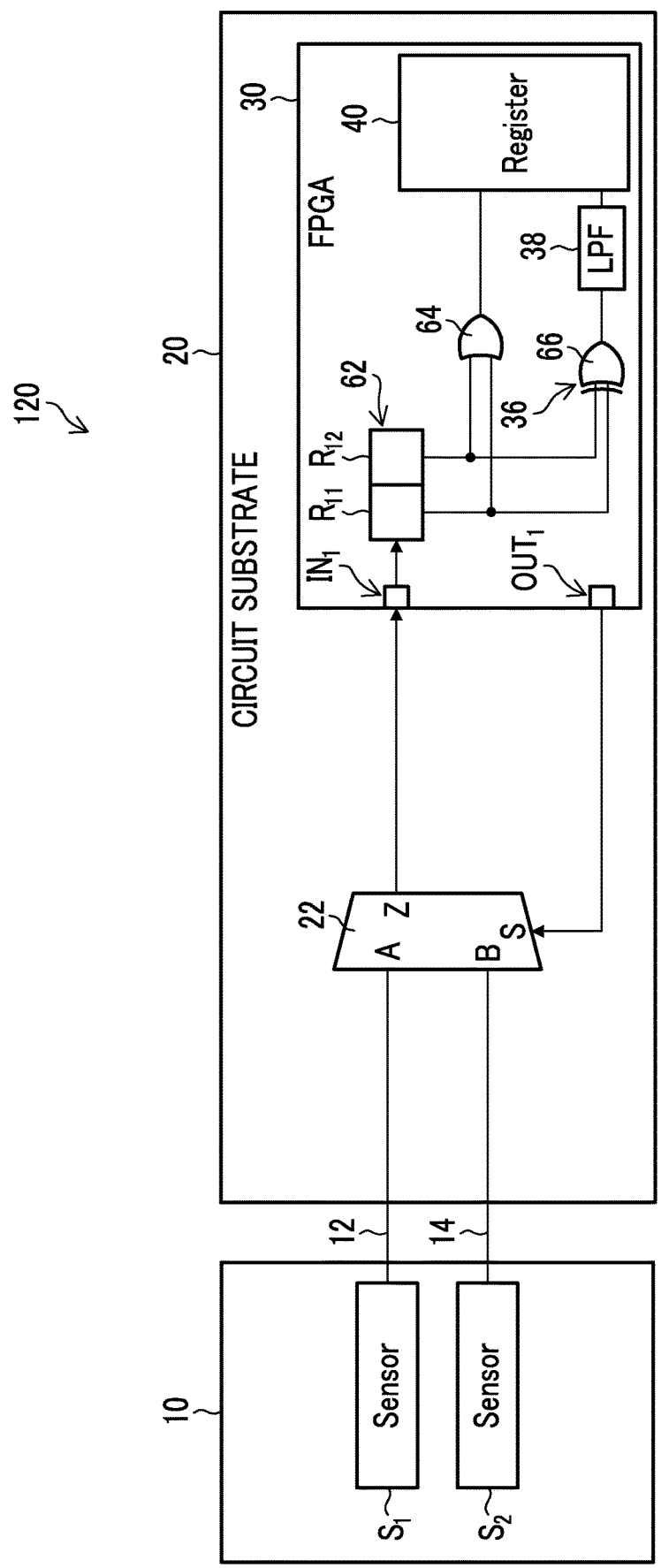
FIG. 9 is a configuration diagram illustrating an overall configuration of the state determination apparatus according to the embodiment.

FIG. 9 is a configuration diagram illustrating an overall configuration of a state determination apparatus 120 according to a third embodiment. Common parts in the configuration diagram illustrated in FIG. 3 will be designated by the same reference signs, and detailed descriptions of such parts will not be repeated.

The FPGA 30 outputs a selection signal $CLK_3$ that is a rectangular signal having a frequency of 1 kHz and a duty of 50% from an $OUT_1$ terminal. The selection signal $CLK_3$ is input into the S terminal of the selector 22 mounted on the circuit substrate 20.

In addition, the FPGA 30 comprises a shift register 62, a sensor detection circuit OR gate 64, and a failure detection circuit exclusive OR gate (XOR gate) 66.

The shift register 62 is configured such that an initial stage register $R_{11}$ and a last stage register $R_{12}$ are connected in series. That is, the $IN_1$ terminal is connected to the input of the initial stage register $R_{11}$. The output of the initial stage register $R_{11}$ is connected to the input of the last stage register $R_{12}$.

The FPGA 30 (one example of a second signal generation unit) generates a sampling signal $CLK_4$ that is a rectangular signal having a frequency of 2 kHz and a duty of 50% by multiplying the selection signal $CLK_3$ by 2 and delaying the phase of the selection signal $CLK_3$ by $\pi/2$. The sampling signal $CLK_4$ is input into the shift register 62. The shift register 62 sequentially transfer the output signal of the selector 22 to the initial stage register $R_{11}$ and the last stage register $R_{12}$ with the initial stage register $R_{11}$ and the last stage register $R_{12}$ in synchronization with a falling edge of the sampling signal $CLK_4$.

The sensor detection circuit OR gate 64 is a logical sum element having two inputs. The output signal of the initial stage register $R_{11}$ and the output signal of the last stage register $R_{12}$ are input into the sensor detection circuit OR gate 64. In a case where both of the logical levels of two input signals are the low level, the sensor detection circuit OR gate 64 outputs the logical low level output signal. In a case where one of the logical levels of two input signals is the high level, the sensor detection circuit OR gate 64 outputs the logical high level output signal. The output of the sensor detection circuit OR gate 64 is input into the register 40.

The failure detection circuit exclusive OR gate 66 constituting the failure detection circuit 36 is an exclusive logical sum element having two inputs. The output signals of the initial stage register $R_{11}$ and the last stage register $R_{12}$ are input into the failure detection circuit exclusive OR gate 66. In a case where both of the logical levels of two input signals are the low level or the high level, the failure detection circuit exclusive OR gate 66 outputs the logical low level output signal. In a case where the logical levels of two input signals are different, the failure detection circuit exclusive OR gate 66 outputs the logical high level output signal. The output of the failure detection circuit exclusive OR gate 66 is input into the register 40 through the low-pass filter 38.

Figure 10:
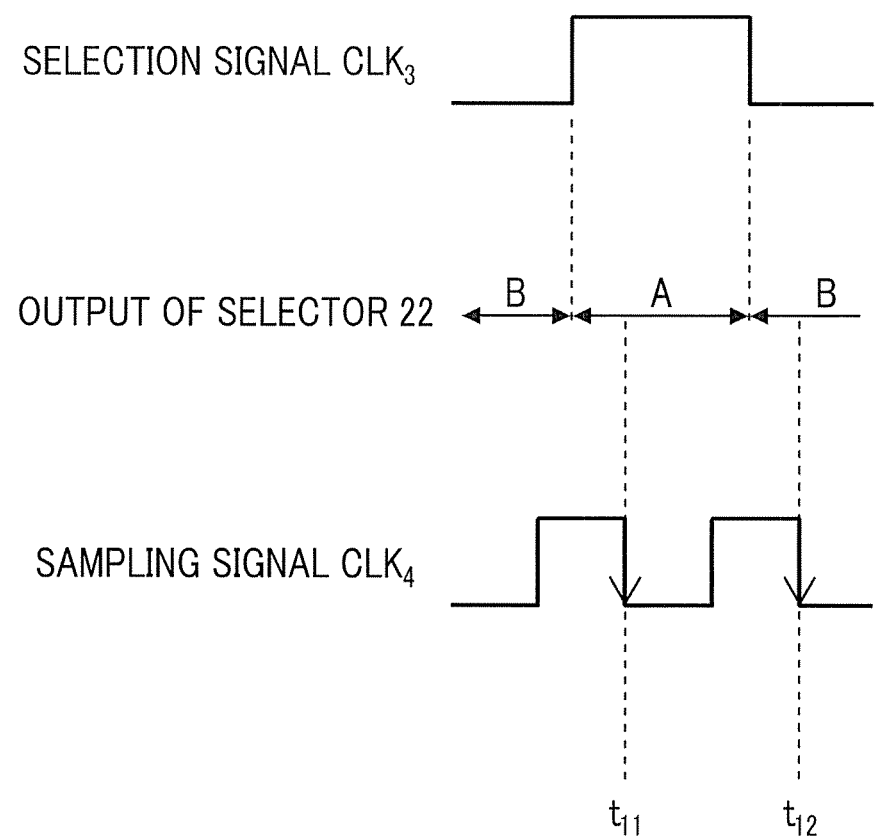

FIG. 10 is a timing chart illustrating the selection signal $CLK_3$, the output signal of the selector 22, and the sampling signal $CLK_4$.

As illustrated in FIG. 10, the logical level of the A terminal into which the detection signal of the sensor $S_1$ is input, and the logical level of the B terminal into which the detection signal of the sensor $S_2$ is input are alternately output from the Z terminal of the selector 22 depending on the logical level of the selection signal $CLK_3$. This signal is input into the shift register 62.

At time $t_{11}$ that is the initial fall timing of the sampling signal $CLK_4$, the logical level of the input signal of the shift register 62 is the logical level of the A terminal. Accordingly, in the shift register 62, the logical level of the A terminal is stored in the initial stage register $R_{11}$.

At time $t_{12}$ that is the subsequent fall timing of the sampling signal $CLK_4$, the logical level of the input signal of the shift register 62 is the logical level of the B terminal. Accordingly, in the shift register 62, the logical level of the B terminal is stored in the initial stage register $R_{11}$. In addition, the logical level of the A terminal stored in the initial stage register $R_{11}$ at time tit is shifted and stored in the last stage register $R_{12}$.

Accordingly, at a time after time $t_{12}$, the logical levels of the output signals of the initial stage register $R_{11}$ and the last stage register $R_{12}$ are the logical level of the B terminal and the logical level of the A terminal, respectively.

Based on the logical levels of both terminals, the logical level of the output signal of the sensor detection circuit OR gate 64 and the logical level of the output signal of the failure detection circuit exclusive OR gate 66 are decided. The register 40 determines whether the determination target object 10 is in the first state or the second state based on the logical level of the signal input from the sensor detection circuit OR gate 64, and performs the diagnosis as to whether or not the sensors $S_1$ and $S_2$ have a malfunction based on the logical level of the output signal of the failure detection circuit exclusive OR gate 66.

In the shift register 62, the logical level of the detection signal of the sensor $S_1$ always coexists with the logical level of the detection signal of the sensor $S_2$ in the storage contents of the initial stage register $R_{11}$ and the last stage register $R_{12}$.

Accordingly, even in a case where one of the sensors $S_1$ and $S_2$ has a malfunction, neither the determination of the state of the determination target object 10 based on the output signal of the sensor detection circuit OR gate 64 is erroneously performed, nor the diagnosis of the failures of the sensors $S_1$ and $S_2$ based on the output signal of the failure detection circuit exclusive OR gate 66 is erroneously performed.

In the present embodiment, the FPGA 30 manages switching of the selector 22, and the sampling signal $CLK_4$ of the shift register 62 is generated by multiplying the selection signal $CLK_3$ of the selector 22 by 2 in the FPGA 30. Thus, the detection results of all sensors can coexist in the shift register 62 in a case where the bit width of the shift register 62 corresponding to the number of sensors (two) is prepared.

In addition, by minimizing the bit width of the shift register 62, the failure detection circuit 36 can be simplified.

Figure 11:
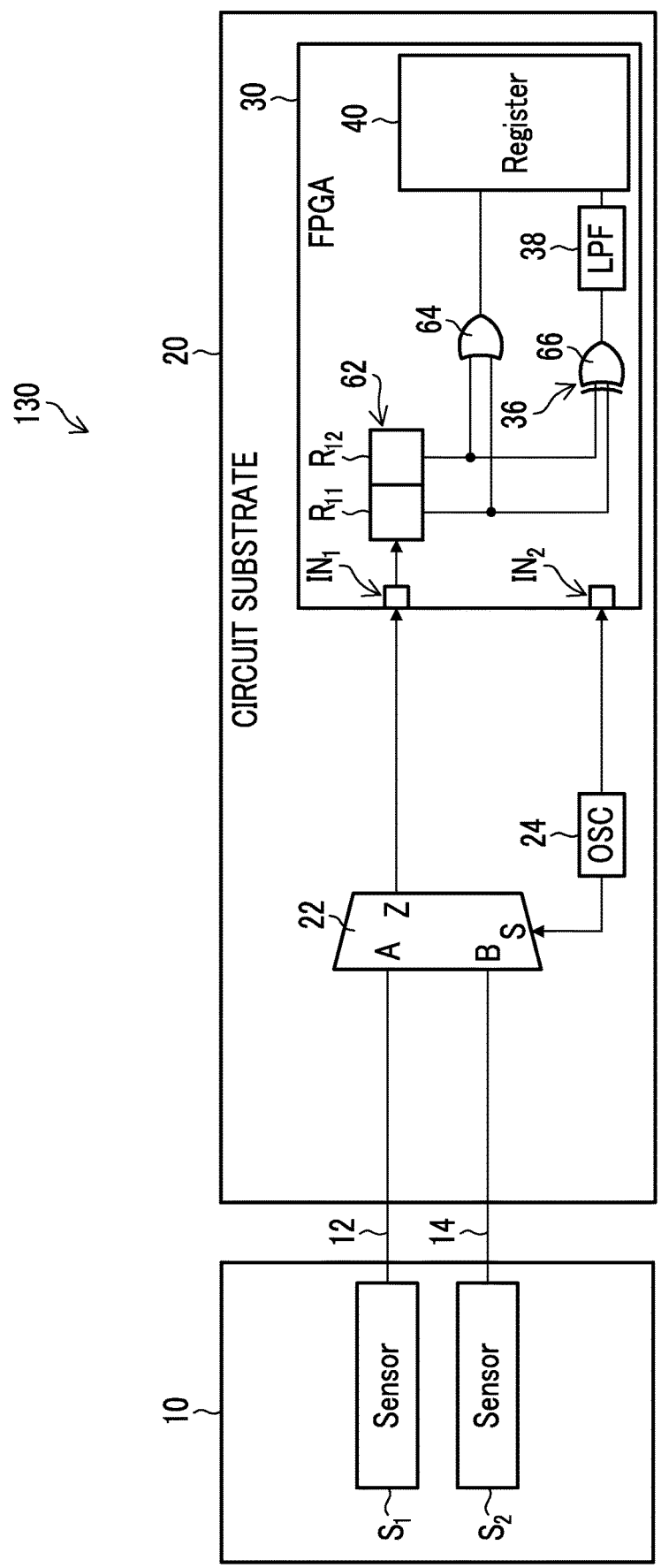
FIG. 11 is a configuration diagram illustrating an overall configuration of the state determination apparatus according to the embodiment.

While the selection signal $CLK_3$ is supplied from the FPGA 30 in the present embodiment, the selection signal $CLK_3$ may be supplied from the oscillator 24. FIG. 11 is a configuration diagram illustrating an overall configuration of a state determination apparatus 130.

In FIG. 11, the selection signal $CLK_3$ is supplied to the selector 22 and the FPGA 30 from the oscillator 24. The FPGA 30 generates the sampling signal $CLK_4$ that is a rectangular signal by multiplying the supplied selection signal $CLK_3$ and delaying the phase of the selection signal $CLK_3$.

Even in the case of such a configuration, the switching of the selector 22 can be managed in the FPGA 30. Thus, the same state detection operation as the state determination apparatus 120 can be performed.

Fourth Embodiment

Figure 12:
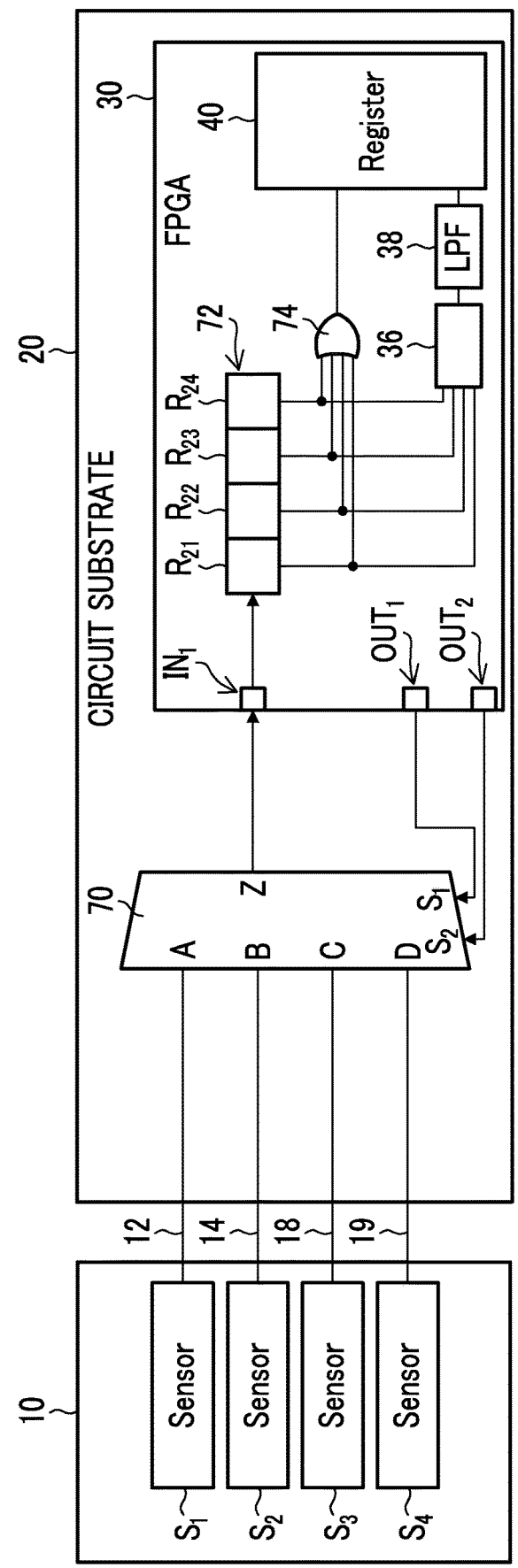
FIG. 12 is a configuration diagram illustrating an overall configuration of the state determination apparatus according to the embodiment.

FIG. 12 is a configuration diagram illustrating an overall configuration of a state determination apparatus 140 according to a fourth embodiment. Common parts in the configuration diagram illustrated in FIG. 9 will be designated by the same reference signs, and detailed descriptions of such parts will not be repeated.

The state determination apparatus 140 comprises four sensors $S_1$, $S_2$, $S_3$, and $S_4$ in the determination target object 10. In addition, the circuit substrate 20 comprises a selector 70 and the FPGA 30, and the FPGA 30 comprises a shift register 72 and a sensor detection circuit OR gate 74.

The sensors $S_3$ and $S_4$ are state detection means equivalent to the sensors $S_1$ and $S_2$. In a case where the determination target object 10 is in the first state, the sensors $S_3$ and $S_4$ output the logical high level detection signal. In a case where the determination target object 10 is in the second state different from the first state, the sensors $S_3$ and $S_4$ output the logical low level detection signal.

The selector 70 is a selection circuit element comprising the A terminal, the B terminal, a C terminal, and a D terminal into which selected signals are input, an $S_1$ terminal and an $S_2$ terminal into which selection signals are input, and the Z terminal from which a selection result is output.

In a case where both of the logical levels of the input signals of the $S_1$ terminal and the $S_2$ terminal are the high level, the selector 70 selects and outputs the logical level of the input signal of the A terminal from the Z terminal. In a case where the logical levels of the input signals of the $S_1$ terminal and the $S_2$ terminal are the high level and the low level, the selector 70 selects and outputs the logical level of the input signal of the B terminal from the Z terminal. In a case where the logical levels of the input signals of the $S_1$ terminal and the $S_2$ terminal are the low level and the high level, the selector 70 selects and outputs the logical level of the input signal of the C terminal from the Z terminal. In a case where both of the logical levels of the input signals of the $S_1$ terminal and the $S_2$ terminal are the low level, the selector 70 selects and outputs the logical level of the input signal of the D terminal from the Z terminal.

The detection signal of the sensor $S_1$ is input into the A terminal of the selector 70 through the wire 12, and the detection signal of the sensor $S_2$ is input into the B terminal of the selector 70 through the wire 14. In addition, the detection signal of the sensor $S_3$ is input into the C terminal of the selector 70 through a wire 18, and the detection signal of the sensor $S_4$ is input into the D terminal of the selector 70 through a wire 19.

The FPGA 30 outputs a selection signal $CLK_5$ that is a rectangular signal having a frequency of 1 kHz and a duty of 50% from the $OUT_1$ terminal. In addition, a selection signal $CLK_6$ obtained by shifting the phase of the selection signal $CLK_5$ by $\pi/2$ is output from an $OUT_2$ terminal.

The $OUT_1$ terminal and the $OUT_2$ terminal of the FPGA 30 are connected to the $S_1$ terminal and the $S_2$ terminal of the selector 70, respectively. Accordingly, the selection signals $CLK_5$ and $CLK_6$ are input into the selector 70.

In addition, the FPGA 30 generates a sampling signal $CLK_7$ that is a rectangular signal having a frequency of 4 kHz and a duty of 50% by multiplying the selection signal $CLK_5$ by 4 and delaying the phase of the selection signal $CLK_5$ by $\pi/2$.

The shift register 72 is configured such that an initial stage register $R_{21}$, a second stage register $R_{22}$, a third stage register $R_{23}$, and a last stage register $R_{24}$ are connected in series. That is, the $IN_1$ terminal connected to the Z terminal of the selector 70 is connected to the input of the initial stage register $R_{21}$. The output of the initial stage register $R_{21}$ is connected to the input of the second stage register $R_{22}$. The output of the second stage register $R_{22}$ is connected to the input of the third stage register $R_{23}$. The output of the third stage register $R_{23}$ is connected to the input of the last stage register $R_{24}$.

In the shift register 72, the sampling signal $CLK_7$ is input, and the output signal of the selector 70 is sequentially transferred to the initial stage register $R_{21}$, the second stage register $R_{22}$, the third stage register $R_{23}$, and the last stage register $R_{24}$.

The sensor detection circuit OR gate 74 is a logical sum element having four inputs. The output signal of the initial stage register $R_{21}$, the output signal of the second stage register $R_{22}$, the output signal of the third stage register $R_{23}$, and the output signal of the last stage register $R_{24}$ are input into the sensor detection circuit OR gate 74. In a case where all of four input signals are at the low level, the sensor detection circuit OR gate 74 outputs the low level output signal. In a case where at least one of four input signals is at the high level, the sensor detection circuit OR gate 74 outputs the high level output signal. The output of the sensor detection circuit OR gate 74 is input into the register 40.

In addition, four output signals of the initial stage register $R_{21}$, the second stage register $R_{22}$, the third stage register $R_{23}$, and the last stage register $R_{24}$ are input into the failure detection circuit 36. In a case where all of the sensors $S_1$ to $S_4$ are normal, the failure detection circuit 36 outputs the low level signal. In a case where at least one of the sensors $S_1$ to $S_4$ has a malfunction, the failure detection circuit 36 outputs the high level signal.

While details of the failure detection circuit 36 will not be described, for example, each of the AND gate 50 and the NOR gate 52 of the failure detection circuit 36 illustrated in FIG. 4 may be replaced with a gate element having four inputs and be applied.

Figure 13:
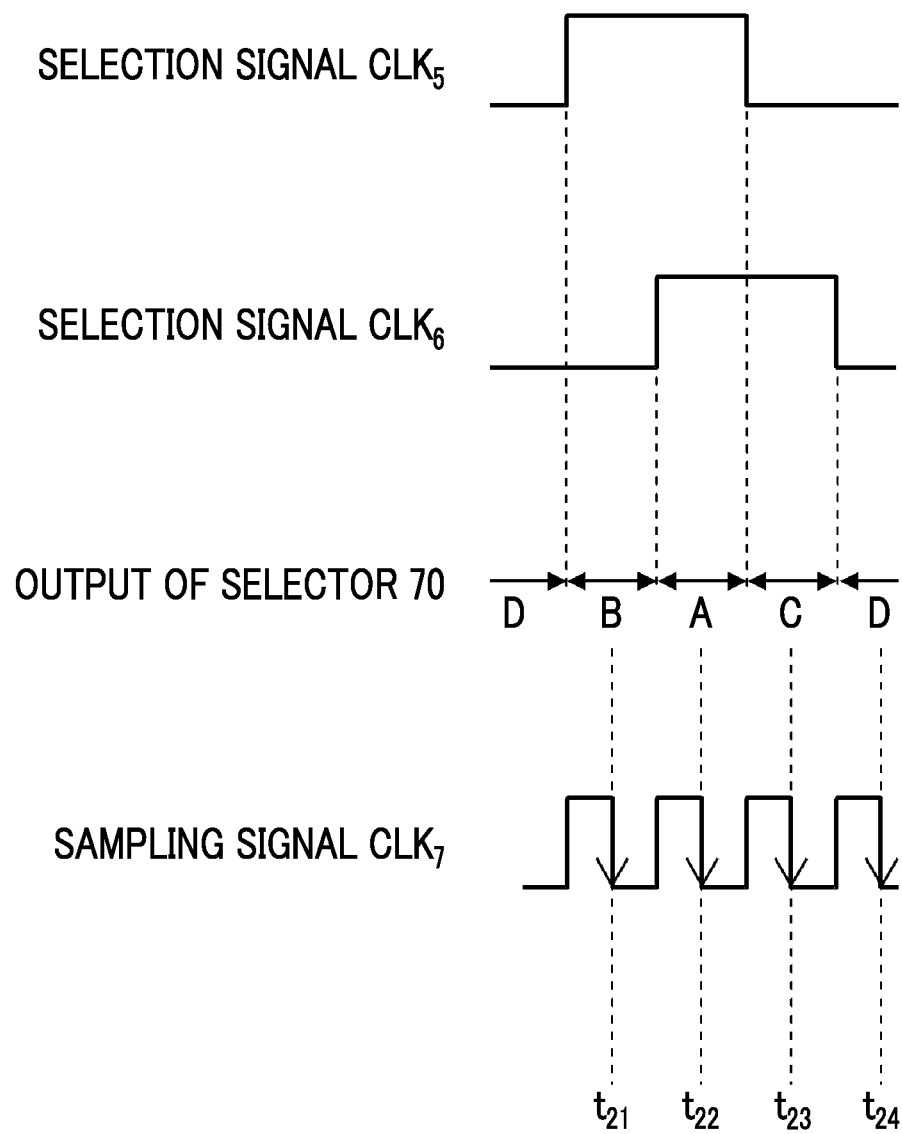

FIG. 13 is a timing chart illustrating the selection signal $CLK_5$, the selection signal $CLK_6$, the output signal of the selector 70, and the sampling signal $CLK_7$.

As illustrated in FIG. 13, the output of the selector 70 is such that the logical level of the B terminal into which the detection signal of the sensor $S_2$ is input, the logical level of the A terminal into which the detection signal of the sensor $S_1$ is input, the logical level of the C terminal into which the detection signal of the sensor $S_3$ is input, and the logical level of the D terminal into which the detection signal of the sensor $S_4$ is input are output in this order depending on the logical levels of the selection signals $CLK_5$ and $CLK_6$. This signal is input into the shift register 72.

In the same manner as described thus far, at times $t_{21}$, $t_{22}$, $t_{23}$, and $t_{24}$ that are fall timings of the sampling signal $CLK_7$, the logical level of the B terminal, the logical level of the A terminal, the logical level of the C terminal, and the logical level of the D terminal that are input signals of the shift register 72 are stored and transferred in this order, respectively.

Consequently, at a time after time $t_{24}$, the logical levels of the output signals of the initial stage register $R_{21}$, the second stage register $R_{22}$, the third stage register $R_{23}$, and the last stage register $R_{24}$ are the logical level of the D terminal, the logical level of the C terminal, the logical level of the A terminal, and the logical level of the B terminal, respectively.

Based on the logical level of each terminal, the logical level of the output signal of the sensor detection circuit OR gate 74 and the logical level of the output signal of the failure detection circuit 36 are decided. The register 40 determines whether the determination target object 10 is in the first state or the second state based on the logical level of the signal input from the sensor detection circuit OR gate 74, and performs the diagnosis as to whether or not at least one of the sensors $S_1$ to $S_4$ has a malfunction based on the logical level of the output signal of the failure detection circuit 36.

By increasing the number of selection signals of the selector 70 depending on the number of sensors, the state determination based on the output signals of three or more sensors and the diagnosis of three or more sensors can be performed. In addition, by generating the sampling signal by multiplying the selection signal depending on the number of sensors, the detection results of all sensors can coexist in the shift register 72 by configuring the number of registers of the shift register 72 to be equal to the number of sensors.

Fifth Embodiment

Figure 14:
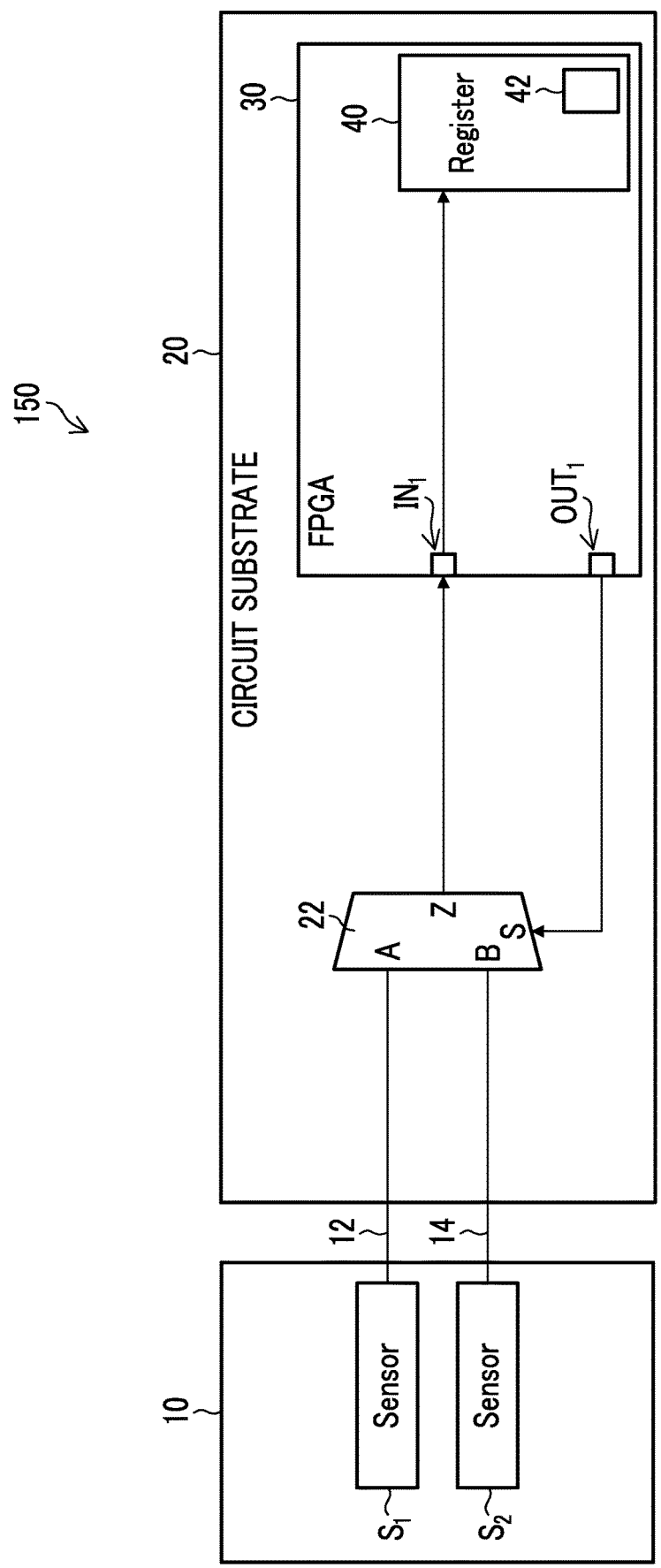
FIG. 14 is a configuration diagram illustrating an overall configuration of the state determination apparatus according to the embodiment.

FIG. 14 is a configuration diagram illustrating an overall configuration of a state determination apparatus 150 according to a fifth embodiment. Common parts in the configuration diagram illustrated in FIG. 9 will be designated by the same reference signs, and detailed descriptions of such parts will not be repeated.

In the state determination apparatus 150, the Z terminal of the selector 22 is connected to the $IN_1$ terminal of the FPGA 30, and the $IN_1$ terminal is connected to the register 40 inside the FPGA 30. Accordingly, the output signal of the Z terminal of the selector 22 is directly input into the register 40.

The FPGA 30 outputs the selection signal $CLK_3$ that is a rectangular signal having a frequency of 1 kHz and a duty of 50% from the $OUT_1$ terminal. The selection signal $CLK_3$ is input into the S terminal that is a selection input terminal of the selector 22 mounted on the circuit substrate 20.

In addition, the FPGA 30 generates the sampling signal $CLK_4$ that is a rectangular signal having a frequency of 2 kHz and a duty of 50% by multiplying the selection signal $CLK_3$ by 2 and delaying the phase of the selection signal $CLK_3$ by $\pi/2$.

The register 40 (one example of a calculation unit) sequentially reads the logical level of the $IN_1$ terminal and the logical level of the selection signal $CLK_3$ in synchronization with at least the falling edges of the sampling signal $CLK_4$ corresponding in number to the sensors, and stores the read logical levels in a memory 42. Since two sensors including the sensors $S_1$ and $S_2$ are used, the logical level of the $IN_1$ terminal is read at least twice.

Based on the reading result, the register 40 can determine the state of the determination target object 10.

In addition, from the logical level of the selection signal $CLK_3$, the register 40 can determine any of the sensors $S_1$ and $S_2$ of which the logical level of the detection signal is the read logical level of the $IN_1$ terminal. Accordingly, any sensor having a malfunction in a case where the logical levels of the sensors $S_1$ and $S_2$ do not match can be found.

Application Example of State Determination Apparatus

Configuration of State Determination Apparatus

Figure 15:
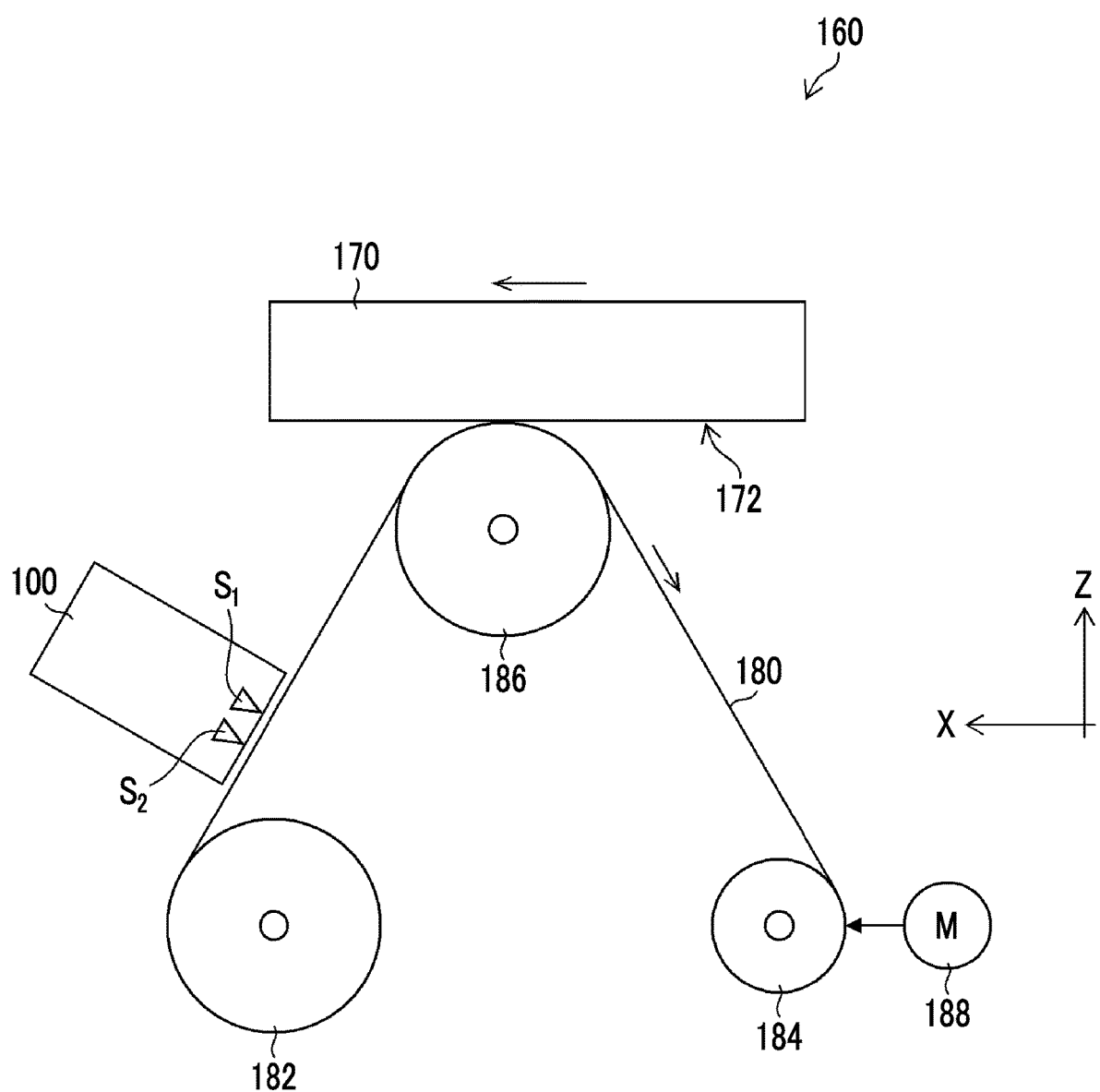
FIG. 15 is a front view illustrating a schematic configuration of a nozzle surface wiping apparatus to which the state determination apparatus is applied.

FIG. 15 is a front view illustrating a schematic configuration of a nozzle surface wiping apparatus 160 to which the state determination apparatus 100 is applied.

The nozzle surface wiping apparatus 160 wipes a nozzle surface 172 while moving an abutting position between a wiping web 180 and the nozzle surface 172 by pressing the wiping web 180 to abut the nozzle surface 172 of an ink jet head 170 that moves in the leftward direction in the drawing.

The nozzle surface wiping apparatus 160 comprises a supply shaft 182 unwinding the wiping web 180, a winding shaft 184 winding the wiping web 180, a pressing roller 186 pressing the wiping web 180 to abut the nozzle surface 172, and a winding shaft rotation drive motor 188 rotationally driving the winding shaft 184.

The wiping web 180 is formed of a long-shaped absorbent sheet material that includes knit or fabric formed using microfiber such as polyethylene terephthalate, polyethylene, nylon, or acrylic. The width of the wiping web 180 corresponds to the width in a short direction of the nozzle surface 172 of the ink jet head 170 as a wiping target, that is, the width in a direction orthogonal to the movement direction of the ink jet head 170, and is equal to or approximately equal to the width in the short direction of the nozzle surface 172.

In addition, the wiping web 180 is in a state where the wiping web 180 is moisturized in advance by absorbing a cleaning liquid for cleaning the nozzle surface 172. The nozzle surface 172 is wiped by the moisturized wiping web 180. The wiping web 180 in a dry state may be set to be in the moisturized state by applying the cleaning liquid to the wiping web 180 on a traveling path of the wiping web 180. Alternatively, the cleaning liquid may be applied to the nozzle surface 172, and the nozzle surface 172 on which the cleaning liquid is applied may be wiped by the wiping web 180 in the dry state.

The supply shaft 182 is arranged horizontally and orthogonally with respect to the movement direction of the ink jet head 170 and is rotatably supported by a bearing, not illustrated. A reel, not illustrated, is attachably and detachably mounted on the supply shaft 182. The wiping web 180 is wound in a roll shape on the reel and is mounted on the supply shaft 182.

The winding shaft 184 is arranged horizontally and orthogonally with respect to the movement direction of the ink jet head 170 and is rotatably supported by a bearing, not illustrated. A reel, not illustrated, is attachably and detachably mounted on the winding shaft 184. The wiping web 180 is wound in a roll shape on the reel mounted on the winding shaft 184.

The pressing roller 186 that is an abutting member has a roller shape (cylindrical shape) and is arranged horizontally and orthogonally with respect to the movement direction of the ink jet head 170. The length of the pressing roller 186 orthogonal to a diameter direction of the pressing roller 186 is a length corresponding to the width of the wiping web 180. The size in the diameter direction of the pressing roller 186 can be appropriately decided. The pressing roller 186 is rotatably and upward and downward movably supported in a state where the pressing roller 186 is biased in the upward direction of a Z direction (vertical direction).

The winding shaft rotation drive motor 188 as a rotation drive source of the winding shaft 184 rotationally drives the winding shaft 184.

The wiping web 180 is wound on the upper side circumferential surface of the pressing roller 186 and travels between the supply shaft 182 and the pressing roller 186. Accordingly, the wiping web 180 is pressed to abut the nozzle surface 172 of the ink jet head 170 through the pressing roller 186. In addition, the ink jet head 170 moves in the leftward direction in the drawing. Accordingly, the nozzle surface 172 is wiped by the wiping web 180.

The state determination apparatus 100 is arranged between the supply shaft 182 and the pressing roller 186 on the traveling path of the wiping web 180.

The sensors $S_1$ and $S_2$ are sensors detecting the state of the wiping web 180. In a case where the wiping web 180 is present, the sensors $S_1$ and $S_2$ output the logical high level detection signals. In a case where the wiping web 180 is not present, the sensors $S_1$ and $S_2$ output the logical low level detection signals. For example, a light projection and reception sensor that detects the presence of the wiping web 180 based on whether or not light projected from a light projection unit is received by a light reception unit can be used as the sensors $S_1$ and $S_2$.

A remaining amount decrease detection hole and a no remaining amount detection hole different from the remaining amount decrease detection hole, not illustrated, are formed near the end of the wiping web 180. The state determination apparatus 100 detects those holes by the sensors $S_1$ and $S_2$ and controls the nozzle surface wiping apparatus 160 depending on the number of detected holes. That is, in a case where the remaining amount decrease detection hole as the first hole is detected, the user is instructed to replace the wiping web 180. In a case where the no remaining amount detection hole as the second hole is detected, the wiping operation of the nozzle surface wiping apparatus 160 is stopped.

Fail-Safe Design of State Determination Apparatus

The fail-safe design in a case where the sensor $S_1$ or $S_2$ fails due to the logical level of the detection signal fixed at the high level will be described.

For example, in a case where the sensor $S_1$ is fixed at the high level and fails, the failed sensor $S_1$ is in a "wiping web remaining amount present" state at all times.

In this case, the wiping operation can be performed. Thus, the nozzle surface wiping apparatus 160 continues the wiping operation. Then, in a case where the remaining amount decrease detection hole and the no remaining amount detection hole of the wiping web 180 pass through the position of the state determination apparatus 100, a state where the remaining amount of the wiping web 180 is not present is detected by the normally operating sensor $S_2$. Accordingly, since the high level detection signal of the sensor $S_1$ does not match the low level detection signal of the sensor $S_2$, the failure detection circuit 36 diagnoses one of the sensors $S_1$ and $S_2$ as having a malfunction. Based on the diagnosis result, a notification of the sensor failure is provided by an interface, not illustrated.

The state determination apparatus 100 determines "wiping web remaining amount present" based on the detection result of the sensor $S_1$. Based on this result, the nozzle surface wiping apparatus 160 continues the wiping operation for the nozzle surface 172.

In a case where the remaining amount of the wiping web 180 unwound from the supply shaft 182 is not present, the wiping web 180 is not wound on the winding shaft 184 by the winding shaft rotation drive motor 188, and the nozzle surface wiping apparatus 160 detects an operation malfunction error for the wiping web 180 and stops.

Then, the nozzle surface wiping apparatus 160 and the state determination apparatus 100 can be recovered by specifying and replacing the failed sensor $S_1$ for which the notification of "wiping web remaining amount present" is provided by the display light emitting diodes $PD_1$ and $PD_2$.

While the state determination apparatus 100 is applied to the state determination of the wiping web 180 of the nozzle surface wiping apparatus 160 in the present embodiment, the state determination apparatus 100 may be applied to a determination as to whether or not the reel of the wiping web 180 is mounted on the supply shaft 182, or a determination as to whether or not the pressing roller 186 abuts the nozzle surface 172.

Others

The technical scope of the present invention is not limited to the scope disclosed in the embodiments. The configurations and the like in each embodiment can be appropriately combined between embodiments without departing from the gist of the present invention.

EXPLANATION OF REFERENCES

10: determination target object
12, 14, 16, 18, 19: wire
20: circuit substrate
22: selector
24: oscillator
30: FPGA
32: shift register
34, 64, 74: sensor detection circuit OR gate
36: failure detection circuit
38: low-pass filter
40: register
42: memory
50: AND gate
52, 54: NOR gate
60: selector substrate
62: shift register
66: failure detection circuit exclusive OR gate
70: selector
72: shift register
100, 110, 120, 130, 140, 150, 200: state determination apparatus
160: nozzle surface wiping apparatus
170: ink jet head
172: nozzle surface
180: wiping web
182: supply shaft
184: winding shaft
186: pressing roller
188: winding shaft rotation drive motor
$CLK_1$, $CLK_3$, $CLK_5$, $CLK_6$: selection signal
$CLK_2$, $CLK_4$, $CLK_7$: sampling signal
$PD_1$, $PD_2$: display light emitting diode
$R_1$: initial stage register
$R_2$: intermediate stage register
$R_3$: last stage register
$R_{11}$: initial stage register
$R_{12}$: last stage register
$R_{21}$: initial stage register
$R_{22}$: second stage register
$R_{23}$: third stage register
$R_{24}$: last stage register
$S_1$ to $S_4$: sensor

What is claimed is:

1. A state determination apparatus comprising:
a plurality of sensors that detect a state of the same determination target in a duplicated manner, each sensor outputting a high level detection signal in a case where the determination target is in a first state and outputting a low level detection signal in a case where the determination target is in a second state different from the first state;
a selector element that receives an input of the detection signal of each sensor of the plurality of sensors and sequentially outputs the detection signal of one sensor among the detection signals of the sensors in synchronization with a first clock signal having a first frequency; and a calculation element that receives an input of an output signal of the selector element, wherein the calculation element includes a storage unit that sequentially stores a logical level of the output signal of the selector element in a bit width greater than or equal to the number of the plurality of sensors in synchronization with a second clock signal having a second frequency higher than or equal to the first frequency, a determination unit that determines whether the determination target is in the first state or the second state based on the stored logical levels, and a diagnosis unit that diagnoses a malfunction in at least one sensor of the plurality of sensors based on the stored logical levels, wherein the storage unit is a shift register in which a plurality of registers corresponding in number to the bit width are connected in series, wherein the diagnosis unit includes a gate element that receives an input of an output signal of the plurality of registers, and a filter circuit that attenuates a high-frequency component of an output signal of the gate element, and a time constant of the filter circuit is greater than or equal to a product of a multiplicative inverse of the second frequency and the number of registers of the plurality of registers.

2. The state determination apparatus according to claim 1, wherein the determination unit performs the determination using a logical sum or a non-conjunction of the stored logical levels.

3. The state determination apparatus according to claim 1, wherein the diagnosis unit performs the diagnosis using non-matching between the stored logical levels.

4. The state determination apparatus according to claim 1, wherein the storage unit is a calculation unit that sequentially reads the logical levels of the output signal of the selector element in synchronization with the second clock signal and stores the read logical levels in a memory.

5. The state determination apparatus according to claim 1, wherein the second clock signal is a signal obtained by multiplying the first clock signal and shifting a phase.

6. The state determination apparatus according to claim 5, wherein the number of the bit width is the number of the plurality of sensors.

7. The state determination apparatus according to claim 1, further comprising:

an oscillation circuit, wherein the first clock signal is supplied from the oscillation circuit.

8. The state determination apparatus according to claim 1, wherein the first clock signal is supplied from the calculation element.

9. The state determination apparatus according to claim 1, further comprising:

a plurality of light emitting diodes for which whether or not to emit light is individually controlled depending on a logical level of the detection signal of each sensor of the plurality of sensors.

10. The state determination apparatus according to claim 1, wherein the selector element and the calculation element are mounted on different substrates.

11. The state determination apparatus according to claim 1, wherein the first state is a state where the determination target is not present, and the second state is a state where the determination target is present.

* * * * *